(12) United States Patent
Feller

(10) Patent No.: US 7,852,965 B2
(45) Date of Patent: Dec. 14, 2010

(54) WINDOWED LEVEL DETECTOR FOR PARTIAL RESPONSE CHANNELS

(75) Inventor: Marc Feller, Long Beach, CA (US)

(73) Assignee: Quantum Corporation, San Jose, CA (US)

( * ) Notice: Subject to any disclaimer, the term of this patent is extended or adjusted under 35 U.S.C. 154(b) by 675 days.

(21) Appl. No.: 11/830,570

(22) Filed: Jul. 30, 2007

(65) Prior Publication Data

US 2009/0034646 A1 Feb. 5, 2009

(51) Int. Cl.
*H04L 25/49* (2006.01)

(52) U.S. Cl. .................. 375/290; 375/285; 375/260; 375/287

(58) Field of Classification Search .............. 375/285, 375/260, 261, 284; 714/794, 755
See application file for complete search history.

(56) References Cited

U.S. PATENT DOCUMENTS 5,689,532 A * 11/1997 Fitzpatrick .................. 375/341
7,440,208 B1 * 10/2008 McEwen et al. ............... 360/39
2002/0154430 A1 * 10/2002 Rae et al. ..................... 360/25
2006/0235919 A1 * 10/2006 Lee et al. ..................... 708/426

OTHER PUBLICATIONS

MacKay, David J.C., "Information, Theory, Inference, and Learning Algothrim", Cambridge University Press 2003, p. 339.
Helstrom, Carl W., *Probability and Stochastic Processes for Engineers*, "Derivation of Bayes's Rule", Department of Electrical Engineering and Computer Sciences, University of California, San Diego, 1984, pp. 50-51.
Helstrom, Carl W., *Probability and Stochastic Processes for Engineers*, "Jointly Gaussian Random Variables", Department of Electrical Engineering and Computer Sciences, University of California, San Diego, 1984, p. 136.

* cited by examiner

*Primary Examiner*—Chieh M Fan
*Assistant Examiner*—Qutbuddin Ghulamali
(74) *Attorney, Agent, or Firm*—Baker Botts L.L.P.

(57) ABSTRACT

An estimator of the noiseless output of a noisy partial response channel is described. The estimator operates recursively. In each iteration, the estimator processes a window of the N most recently received noisy channel outputs to compare output level metrics for all possible channel output level, and selects a noiseless output level with maximal posterior probability.

20 Claims, 13 Drawing Sheets

WINDOWED LEVEL DETECTOR FOR PARTIAL RESPONSE CHANNELS

TECHNICAL FIELD

The present disclosure relates generally to detection over noisy communication channels with inter-symbol interference, and more specifically, to the estimation of noiseless channel outputs in the presence of noise.

BACKGROUND

In a time-dispersive communication channel, such as a magnetic storage channel, it is advantageous to filter the channel to provide an equalized channel response which, when synchronously sampled in the absence of noise, provides nonzero integer-valued samples over a limited span. When the span of the equalized response is more than one symbol period in response to a single input, the responses of sequential inputs interfere with one another, and the equalized channel is referred to in the literature as a partial response channel. Partial response channel models, such as a dicode partial response channel, a class-IV partial response (PR4) channel, or an extended class-IV partial response (EPR4) channel, are of particular interest in magnetic recording.

When the output of a partial response channel is synchronously sampled, the response to a given channel input is dependent on the current input and previous channel inputs whose nonzero response is within the interference span of the equalized channel. Each output sample is corrupted by additive noise, which is often assumed to be Gaussian.

For purposes of the following discussion, it is convenient to associate a sequence of symbols, such as $\{u_0, u_1, u_2, \ldots\}$ with the corresponding D-transform of the sequence, $$U(D) = \sum_{i=0}^{\infty} u_i D^i,$$

where $u_i$ is the $i^{th}$ symbol in the sequence and D is the unit delay operator.

FIG. 1 is a simplified diagram of a typical partial response receiver for magnetic recording channels. The sequence of binary user inputs U(D) is the input to a magnetic channel 100 with time domain dibit response h(t). The output of the channel is corrupted by wideband, additive noise. Analog lowpass filter 101 band-limits the received signal to prevent aliasing in sampler 102. The sampler may be either an analog-to-digital converter, or may alternatively be an analog sample-and-hold circuit. The stream of samples enters equalizer 103, which is typically a finite-impulse-response (FIR) filter. Optionally, equalizer 103 may be adaptive to refine the channel response.

In an ideal system with perfect gain, equalization, timing, and without noise, the combined response of 104 is the desired system partial response polynomial, P(D). The output of the ideal noiseless partial response channel is given by X(D)=U(D)P(D). A partial response polynomial of the form $P(D)=(1-D)(1+D)^R$ is commonly utilized in a magnetic recording system, where R is a non-negative integer. When R=0, P(D)=1−D, and the system is known as a dicode partial response channel. For a PR4 system, R=1 and the partial response polynomial is $P(D)=1-D^2$; for EPR4, R=2 and $P(D)=1+D-D^2-D^3$.

In a real system, the output of the partial response channel is Y(D)=X(D)+E(D), where the various channel imperfections observed at the $i^{th}$ output of the system are lumped into an error term, $e_i$. Under the assumption that channel imperfections are due to conditions which vary slowly as compared to the bit rate of the system, the average channel quality over the most recent observed span of K samples may be monitored. One such method of monitoring channel quality obtains an estimate of the average error variance over a span of K samples in a moving average estimator as shown in FIG. 2.

In the typical receiver of FIG. 1, sampling errors are minimized with decision-directed control loops, which adjust for variations in channel amplitude, timing phase error in sampling, and a misadjusted equalizer. In particular, the performance of the timing recovery loop is critical. The achievable adaptation rate of these control loops is highly dependent on loop delay, and adaptation rates must be reduced for long delays to maintain control loop stability.

The present disclosure relates to methods of estimating the noiseless response of the partial response channel in a detector. Various prior art detection methods for partial response channels are known in the literature. A typical prior art detector of the noiseless channel output sequence for control loop purposes is a slicer, which relies on the expected integer-valued output of the channel. For example, a dicode channel produces noiseless channel outputs of −1, 0, and +1 in the absence of noise. By comparing the sampled channel output to set thresholds of −0.5 and 0.5, for example, a slicer is able to make sample-by-sample estimates of the nearest channel output in the set of all possible noiseless channel outputs. The slicer simply regards the partial response channel as a multi-level communication system, and the $i^{th}$ detector decision is based solely on the observation of the $i^{th}$ noisy channel output.

Another prior art detector is known as a Viterbi detector, which performs maximum likelihood sequence estimation using a multi-state detector, where each state represents a possible combination of interfering channel inputs, in order to fully realize the Viterbi detector's gain, the final decisions of the Viterbi detector typically incur a delay several times the interference span of the channel. A slicer-based detector ignores constraints on the sequence of noiseless outputs of the system imposed by properties of the partial response channel, and tends to have a higher estimation error rate than detectors utilizing this sequence information, such as the Viterbi detector.

Decision-directed control loops typically utilize the estimate of the noiseless response of the channel to estimate gain error, timing error, and equalization error. When the slicer-based detector makes erroneous estimates too often, it further corrupts the estimates used to adjust the channel in the decision-directed control loop. In a noisy environment with a high slicer-based detection error rate, timing recovery may be lost, leading to catastrophic error.

Although the Viterbi detector has improved immunity against noise, two salient features of the Viterbi detector make it less typical as a detector in a decision-directed control loop. First, the Viterbi detector typically has long decision delay. The long inherent delay of the Viterbi detector reduces the adaptive performance of a decision-directed control loop. Second, when erroneous tentative decisions are made in the Viterbi detector, internal feedback of state metrics results in final decisions that contain bursts of multiple estimation errors. When decisions of the Viterbi detector are burstily erroneous, these bursts threaten to further corrupt control of the receiver.

In view of the foregoing, a need exists in the art for a general estimation method for the noiseless output of a partial response channel in decision-directed control loops with reasonable delay, with improved immunity against noise, and with limited error propagation.

SUMMARY

The present invention provides methods, apparatuses and systems directed to estimating the noiseless channel output of a noisy partial response channel with inter-symbol interference. In each recursion, a sliding window of the N most recent consecutive sampled channel outputs and an estimate of the noise power are processed to estimate one of the noiseless samples within the window, where N spans at least two symbols of the channel's inter-symbol interference.

BRIEF DESCRIPTION OF THE DRAWINGS

Example embodiments are illustrated in referenced figures of the drawings. It is intended that the embodiments and figures disclosed herein are to be considered illustrative rather than limiting.

DETAILED DESCRIPTION OF EXAMPLE EMBODIMENTS

Figure 1:
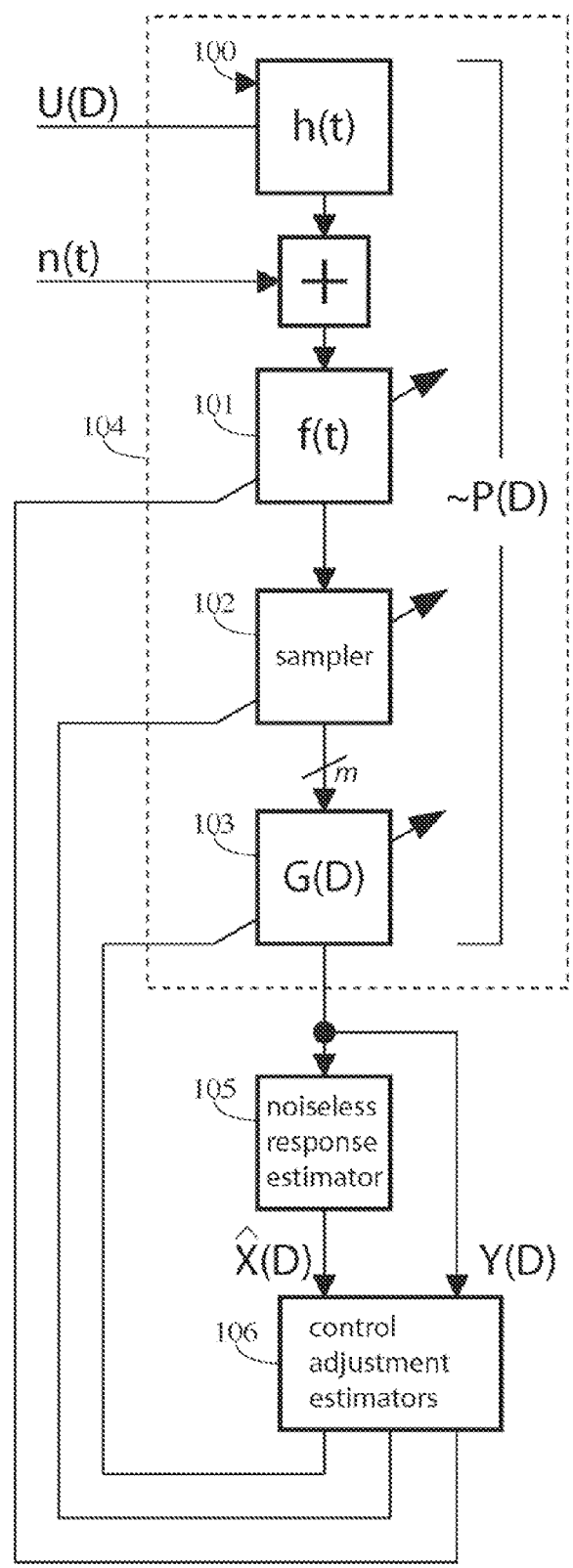
FIG. 1 is a simplified diagram of a partial response receiver for magnetic recording channels.

The following embodiments and aspects thereof are described and illustrated in conjunction with systems, apparatuses and methods which are meant to be exemplary and illustrative, not limiting in scope. In various embodiments, one or more of the above-described problems have been reduced or eliminated. In addition to the aspects and embodiments described above, further aspects and embodiments will become apparent by reference to the drawings and by study of the following descriptions.

The "windowed level detector" of the present disclosure approximately implements a maximal a posterioiri (MAP) decision rule to estimate a noiseless output level by observing the noisy output of a partial response channel. The decision rule is based on a hypothesis-testing algorithm known in the literature as Bayes' Rule. For a general discussion of Bayes' Rule, see Carl W. Helstrom, *Probability and Stochastic Processes for Engineers*, ISBN 0-02-353560-1, Macmillan Publishing Company, New York, 1984, pp. 50-51.

The detector uses a sliding window of length N to examine the output of the channel. More specifically, during the $i^{th}$ recursion of the detector algorithm, the detector output is computed using the most recent N noisy samples at the partial response channel output, $\{y_{i-N+1}, y_{i-N+2}, \ldots, y_i\}$.

The detector's decision rule utilizes pre-determined knowledge of the possible noiseless output subsequences of the partial response channel and the prior probability that each such noiseless output subsequence will occur at the output of the channel. In one recursion of the detector, the detector associates each possible noiseless output subsequence of length N with a quantity, said quantity related to the posterior probability of the possible subsequence, and various quantities are combined to find output level probabilities. A noiseless output level with highest probability is the defector's output estimate, denoted $$\hat{x}_j,$$

where $i-N<j<i+1$.

The detector proceeds in similar fashion in the next recursion, comparing probabilities based on the window of samples $\{y_{i-N+2}, y_{i-N+3}, \ldots, y_{i+1}\}$, choosing a most likely noiseless signal level, and issuing an estimate $\hat{x}_{j+1}$ of $x_{j+1}$.

Note that the output estimate of the present embodiment in recursion (i+1) does not depend on feedback from the estimate of the detector in recursion i. An advantage of the windowed level detector is that the effect of a very noisy sample is limited to at most N decisions of the detector.

To determine signal level probabilities, the invention relies on the principle of total probability. See Helstrom, *Probability and Stochastic Processes for Engineers*, ISBN 0-02-353560-1, Macmillan Publishing Company, New York, 1984, pp. 25-26. Suppose that there are a total of M distinct possible noiseless output subsequences of length N at the output of the partial response channel, denoted $S_1, S_2, \ldots, S_M$. Let $E_i$ be the event that the noiseless output subsequence transmitted is $S_i$. Let a sample space $\Omega$ be the event that any one of the M sequences is transmitted for the current window. The events $\{E_i\}$ partition the sample space. By the theorem of total probability, for any event F, $$Pr[F \mid \Omega] = \sum_{i=1}^{M} Pr[E_i] Pr[F \mid E_i],$$

where Pr[E] denotes the probability of event E, and Pr[F|E] denotes the conditional probability of event F given event E.

Let $F_L$ be the event that a transmitted noiseless sequence takes the noiseless output level L in the $j^{th}$ noiseless sample. The term $Pr[E_i] Pr[F_L|E_i]$ denotes the posterior probability of observing the window of noisy samples given that the noiseless input is sequence $S_i$, as elucidated below. The estimated output level L is the output level with highest total probability, $$\text{Max}_L \{Pr[F_L|\Omega]\}.$$

A subsequence's posterior probability may be defined and approximated in the detector as follows. Let Pr[v] denote the prior probability of a possible N-sample noiseless output subsequence $v=\{v_1, v_2, \ldots, v_N\}$.

Under a condition that $$\{x_{i-N+1}, x_{i-N+2}, \ldots, x_i\} = \{v_1, v_2, \ldots, v_N\},$$

the N-variate joint probability density function of random channel outputs is denoted $$f_{z_1 z_2 \ldots z_N}(z_1, z_2, \ldots, z_N | v_1, v_2, \ldots, v_N).$$

A conditional probability of observing a particular set of noisy samples $$\{y_{i-N+1}, y_{i-N+2}, \ldots, y_i\}$$

under the condition is denoted $$Pr[y_{i-N+1}, y_{i-N+2}, \ldots, y_i | v_1, v_2, \ldots, v_N].$$

The conditional probability is obtained analytically by performing the N-dimensional integration of the conditional probability density function over the appropriate quantization level span of each the observed noisy samples, $$Pr[y_{i-N+1}, y_{i-N+2}, \ldots, y_i | H_v] = \iint \ldots \int f_{z_1 z_2 \ldots z_N}(z_1, z_2, \ldots, z_N | v_1, v_2, \ldots, v_N) \, dz_1 \, dz_2 \ldots dz_N.$$

The posterior probability under the condition is defined as the product of the prior subsequence probability and the conditional probability, $$P_v = Pr[v] Pr[y_{i-N+1}, y_{i-N+2}, \ldots, y_i | v_1, v_2, \ldots, v_N].$$

Implementation methods of the present invention are elucidated with two example embodiments of windowed level detectors for dicode channels, and an embodiment for EPR4 channels. The example windowed level detectors for dicode channels of the present disclosure utilize a sliding window of the three most recently observed samples in the $i^{th}$ recursion, $$\{y_{i-2}, y_{i-1}, y_i\}.$$

In general, the sliding window may span a greater number of samples, such as the five most recently observed samples, and decisions may be based on all or a subset of the observed samples in the sliding window.

A dicode channel has the property that there are three possible noiseless sample values, $\{-1, 0, 1\}$. The noiseless output of a dicode channel has the further property that, if $x_i$ and $x_{i-1}$ are both nonzero, then $x_i = -x_{i-1}$. Because of this property, the detector need only consider fifteen possible output subsequences of length three. In the following list, the subsequences are grouped according to the central noiseless sample value. The hypothesis $H_1$ is that the central sample value is a −1, the hypothesis $H_2$ is that the central sample value is a 0, and the hypothesis $H_3$ is that the central sample value is a 1. In this example, the first group consists of four subsequences with a noiseless central sample value of −1, each in the second group of seven sequences has a noiseless central sample value of 0, and each in the third group of four subsequences has a central noiseless sample value of 1. Each subsequence is assigned a hypothesis number, a subsequence number, a set of three noiseless sample values, and a prior probability, as explained below.

TABLE 1

Noiseless output sequences of length three at the output of a dicode channel.

| Hypo | subsequence | $x_{i-2}$ | $x_{i-1}$ | $x_i$ | p[subsequence] |
|------|-------------|-----------|-----------|-------|----------------|
| 1 | 1 | 0 | −1 | 0 | 1/16 |
| 1 | 2 | 0 | −1 | 1 | 1/16 |
| 1 | 3 | 1 | −1 | 0 | 1/16 |
| 1 | 4 | 1 | −1 | 1 | 1/16 |
| 2 | 5 | −1 | 0 | 0 | 1/16 |
| 2 | 6 | −1 | 0 | 1 | 1/16 |
| 2 | 7 | 0 | 0 | −1 | 1/16 |
| 2 | 8 | 0 | 0 | 0 | 2/16 |
| 2 | 9 | 0 | 0 | 1 | 1/16 |
| 2 | 10 | 1 | 0 | −1 | 1/16 |
| 2 | 11 | 1 | 0 | 0 | 1/16 |
| 3 | 12 | −1 | 1 | −1 | 1/16 |
| 3 | 13 | 0 | 1 | −1 | 1/16 |
| 3 | 14 | 0 | 1 | 0 | 1/16 |
| 3 | 15 | −1 | 1 | 0 | 1/16 |

The windowed level detector uses pre-determined knowledge of noiseless output sequence probabilities. In a coded system, it is assumed that the receiver has knowledge of the transmitter's sequence probabilities. In this example, random input is assumed. A further property of a dicode system with random inputs is that the average probability of the noiseless all-zero output subsequence, $\{0, 0, 0\}$, is one eighth, while the other noiseless output subsequences each have average probability one sixteenth.

The noisy outputs of the system are assumed to be random variables with a predictable probability distribution. A probability distribution most commonly assumed is that the noise, n(t) in FIG. 1, is additive white Gaussian noise. If the dominant noise component in a communications system is due to a factor other than Gaussian noise, such as Rayleigh fading, a different probability density function more appropriate for the dominant noise source may be used.

Under the assumption of uncorrelated Gaussian noise with the condition that $\{x_{i-2}, x_{i-1}, x_i\} = \{v_1, v_2, v_3\}$, the joint conditional probability density function of the three observed random outputs is a tri-variate Gaussian probability density function, $$f_{z_1 z_2 z_3}(z_1, z_2, z_3 | v_1, v_2, v_3) = [2\pi\sigma^2]^{-3/2} \exp\left[-\frac{(z_1 - v_1)^2 + (z_2 - v_2)^2 + (z_3 - v_3)^2}{2\sigma^2}\right]$$

where $\sigma^2$ is the variance of the random outputs. See Carl W. Helstrom, *Probability and Stochastic Processes for Engineers*, ISBN 0-02-353560-1, Macmillan Publishing Company, New York, 1984, pp. 208-209.

Computation of posterior probabilities is simplified by the additional assumption that quantization spans are small enough that the probability $Pr[y_{i-2}, y_{i-1}, y_i | H_v]$ is proportional to $$c \exp\left[-\frac{(y_{i-2} - v_1)^2 + (y_{i-1} - v_2)^2 + (y_i - v_3)^2}{2\sigma^2}\right],$$

where c is a proportionality constant which may be chosen to simplify the implementation.

Figure 2:
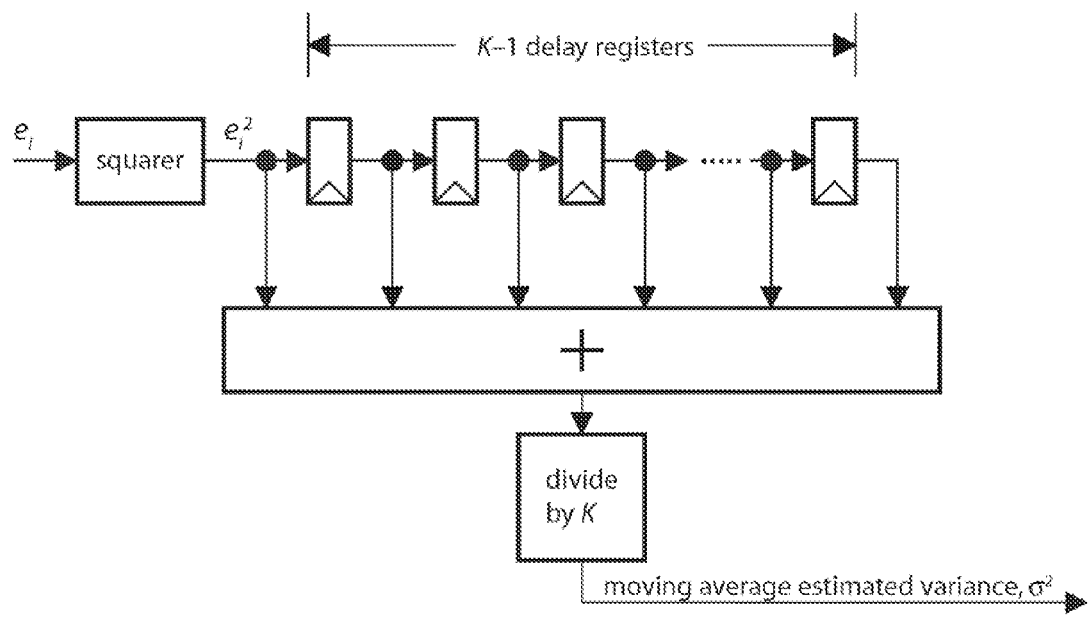
FIG. 2 is a diagram of a moving average noise power estimator.

Let $M_v$ denote a metric proportional to the posterior probability of the noisy output subsequence given the condition that $\{x_{i-2}, x_{i-1}, x_i\} = \{v_1, v_2, v_3\}$. The metric $M_v$ is given by $$M_v = cPr[v] \exp\left[-\frac{(y_{i-2} - v_1)^2 + (y_{i-1} - v_2)^2 + (y_i - v_3)^2}{2\sigma^2}\right],$$

where c is the constant of proportionality. In a partial response receiver, a moving average estimator, such as that shown in FIG. 2, can be used to provide an estimate of the variance, $\sigma^2$, in calculating $M_v$. Alternatively, a fixed estimate of the variance, based on estimated or measured system performance, may be used.

The metric for sequence number 10 in the list above, for example, is proportional to a conditional probability based on the possible sequence $$\{x_{i-2}, x_{i-1}, x_i\} = \{v_1, v_2, v_3\} = \{1, 0, -1\},$$

given by $$M_{10} = \frac{c}{8} \exp\left[-\frac{(y_{i-2}-1)^2 + (y_{i-1})^2 + (y_i+1)^2}{2\sigma^2}\right].$$

The posterior hypothesis probabilities are found by summing the appropriate posterior subsequence probabilities. In this example, $$Pr[H_1] = \sum_{i=1}^{4} M_i,$$

$$Pr[H_2] = \sum_{i=5}^{11} M_i, \text{ and}$$

$$Pr[H_3] = \sum_{i=12}^{15} M_i.$$

In the first example embodiment, the detector computes these posterior probabilities, and compares them to find a maximal posterior probability. The detector outputs the central sample value for a hypothesis with the maximal posterior probability.

Figure 3:
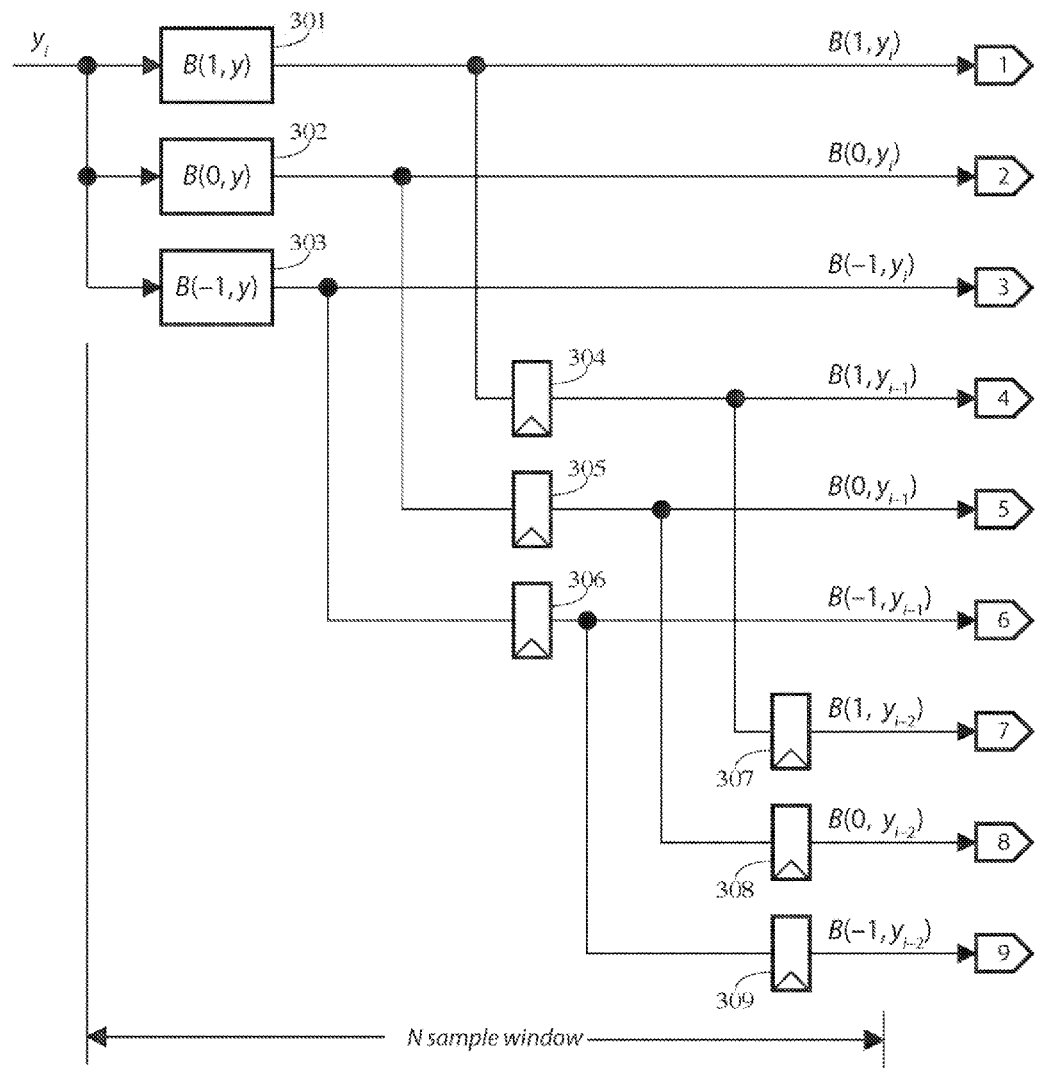
FIG. 3 is a diagram of an example branch metric generator (BMG) for dicode channels with a sliding window length N equal to three.

FIG. 3 is a diagram of a branch metric generator (BMG) for an example windowed level detector for dicode channels. During the $i^{th}$ operation of the branch metric generator, noisy sample $y_i$ enters three "branch" units, 301-303. The output of a branch unit denoted B(x, y) is given by $$B(x, y) = -(x-y)^2.$$

An example branch unit output is $$B(1, y_i) = -(1-y_i)^2 = 2y_i - 1 - y_i^2,$$

which is produced at output number 1 of the BMG.

The BMG also contains two sets of synchronously clocked registers, 304-306 and 307-309, to delay the outputs of the three branch units. The outputs of registers 304-306 are $B(1, y_{i-1})$, $B(0, y_{i-1})$, and $B(-1, y_{i-1})$, respectively, while the outputs of registers 307-309 are $B(1, y_{i-2})$, $B(0, y_{i-2})$, and $B(-1, y_{i-2})$, respectively.

Figure 4:
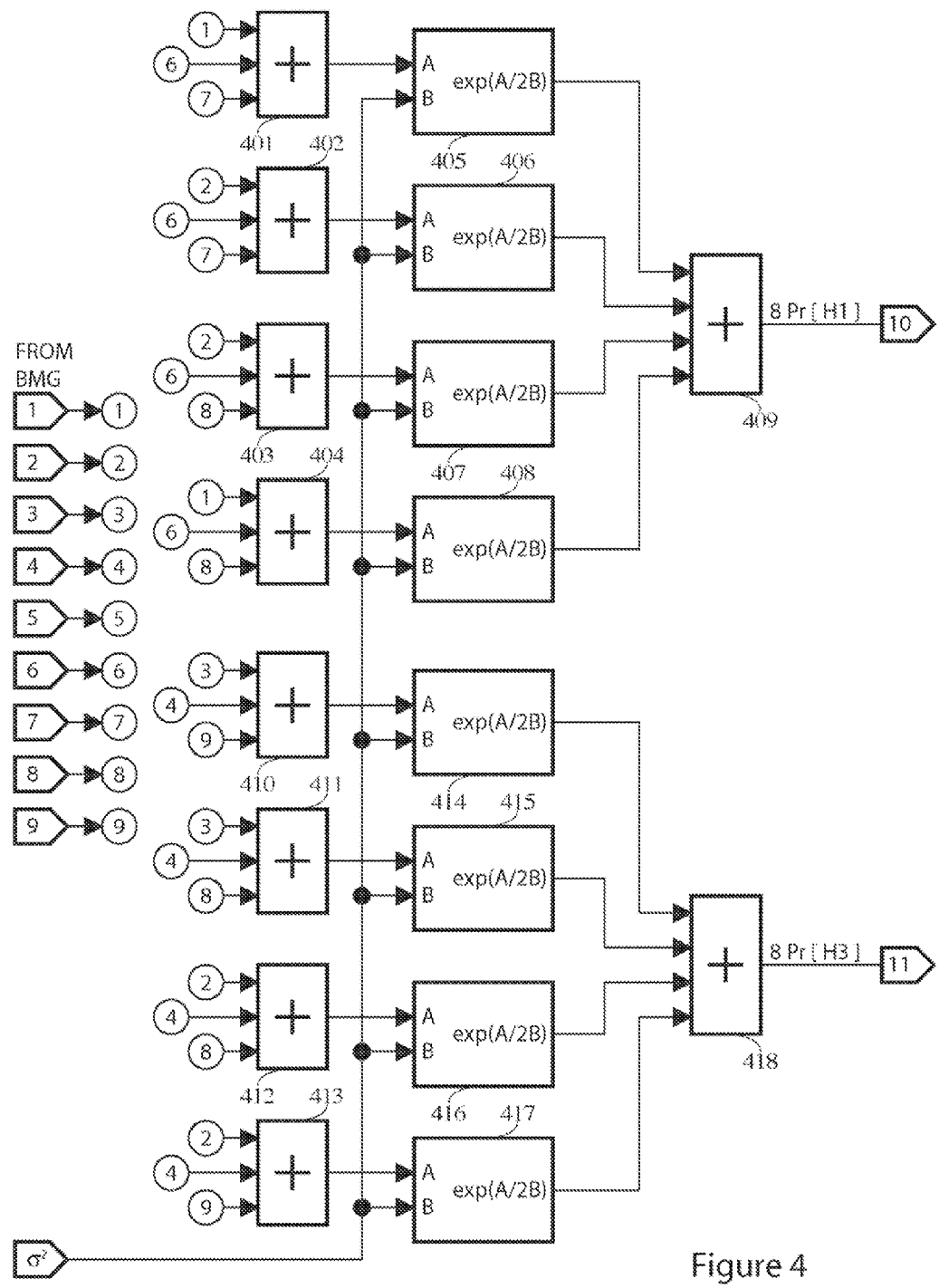
FIG. 4 is a diagram of two example metric generators.

FIG. 4 is a schematic of two example metric generators to produce outputs proportional to the probability of hypothesis $H_1$, denoted $Pr[H_1]$, and the probability of hypothesis $H_3$, denoted $Pr[H_3]$. The inputs to FIG. 4 are the nine outputs of the BMG of FIG. 3, and a noise variance, denoted $\sigma^2$. The metric for sequence number 3 in Table 1, for example, is a conditional posterior probability based on $$\{x_{i-2}, x_{i-1}, x_i\} = \{v_1, v_2, v_3\} = \{1, -1, 0\}.$$

The corresponding three branch outputs, $B(1, y_{i-2})$, $B(-1, y_{i-1})$, $B(1, y_i)$, of the BMG are numbered BMG outputs 7, 6, and 2, which are summed in adder 402 of FIG. 4. Exponentiator unit 406 of FIG. 4 divides the output of adder 402 by double the noise variance and exponentiates the result to produce an output proportional to $M_3$. The other metrics for sequences with a central noiseless sample value of -1, proportional to $M_1$, $M_2$, and $M_4$, are output from exponentiator units 405, 407, and 408. The four metrics are summed in adder 409 to produce an output 10 proportional to the probability that the central noiseless sample value is -1.

Similarly, four metrics $M_{12}$, $M_{13}$, $M_{14}$, and $M_{15}$, produced at the output of exponentiator units 414-417, are summed in adder 418 to produce an output 11 proportional to the probability that the central noiseless sample value is 1.

Figure 5:
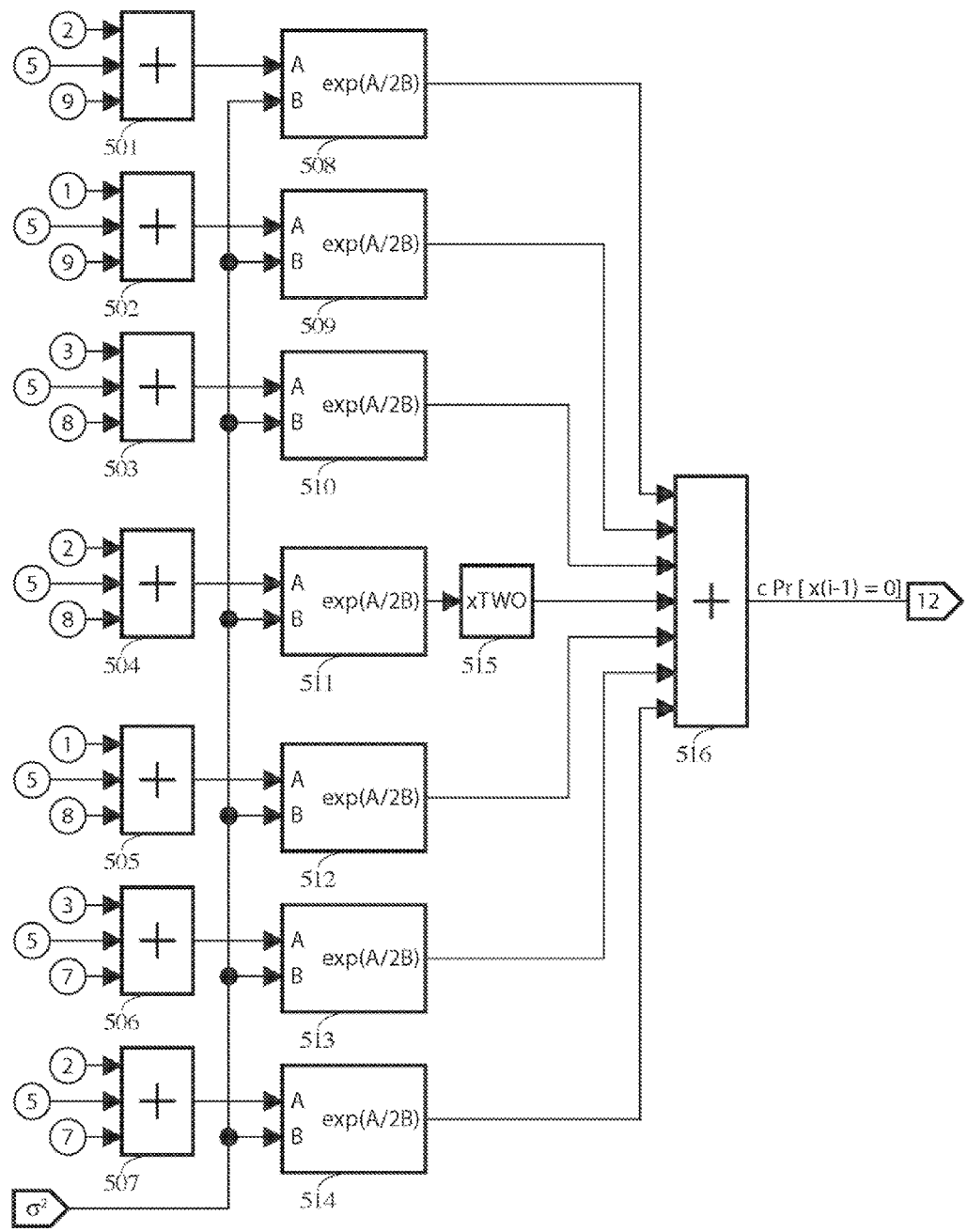
FIG. 5 is a diagram of a third example metric generator.

FIG. 5 is a schematic of an example metric generator to produce an output proportional to the probability of hypothesis $H_0$, $Pr[H_0]$. Table 1 lists seven sequences, numbered 5 to 11, with a central noiseless sample value equal to 0. The metric for sequence number 6 in Table 1, for example, is a conditional posterior probability based on $$\{x_{i-2}, x_{i-1}, x_i\} = \{v_1, v_2, v_3\} = \{-1, 0, 1\}.$$

The corresponding three branch outputs, $B(-1, y_{i-2})$, $B(0, y_{i-1})$, $B(1, y_i)$, of the BMG are numbered BMG outputs 9, 5, and 1, which are summed in adder 502 of FIG. 5. Exponentiator unit 509 divides the output of adder 502 by double the noise variance and exponentiates the result to produce an output proportional to $M_6$. Similar cascaded adder-exponentiator units calculate $M_5$, $M_7$, $M_9$, $M_{10}$, and $M_{11}$ at the outputs of 508, 510, 512, 513, and 514.

In FIG. 5, the metric for sequence number 8 in Table 1, for example, is a conditional posterior probability based on $$\{x_{i-2}, x_{i-1}, x_i\} = \{v_1, v_2, v_3\} = \{0, 0, 0\}.$$

The corresponding three branch outputs, $B(0, y_{i-2})$, $B(0, y_{i-1})$, $B(0, y_i)$, of the BMG are numbered BMG outputs 8, 5, and 2, which are summed in adder 504 Exponentiator unit 511 divides the output of adder 504 by double the noise variance and exponentiates the result to produce an output proportional to one-half $M_8$. Scaling unit 515 multiplies the output of 511 by two to account for the ratio of subsequence probabilities in Table 1 result to produce an output proportional to $M_8$.

The seven metrics of FIG. 5 are summed in adder 516 to produce an output 12 proportional to the probability that the central noiseless sample value is 0.

Figure 6:
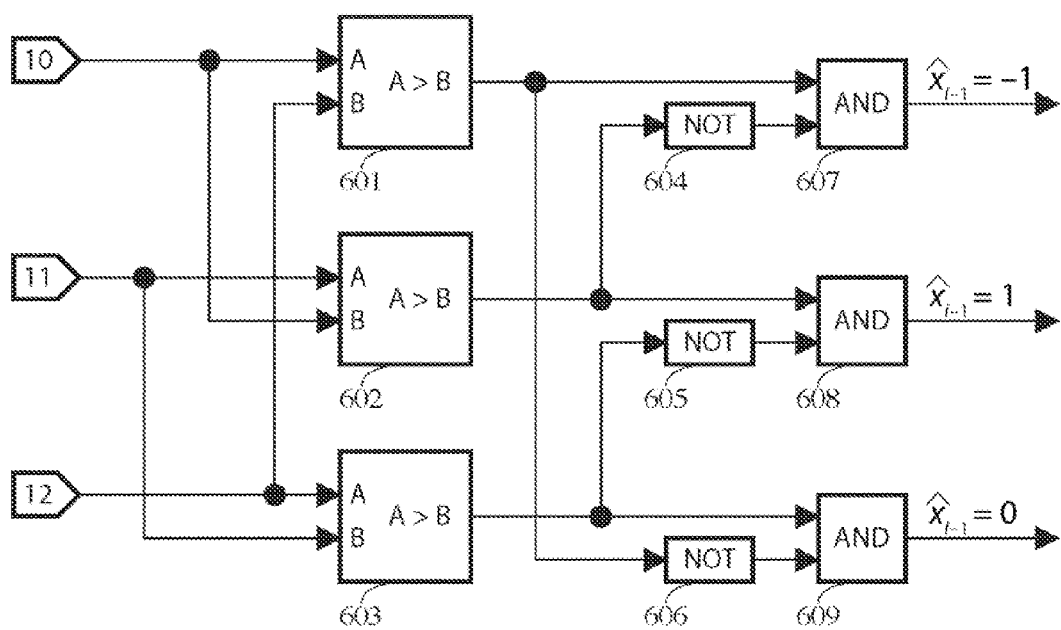
FIG. 6 is a diagram of an example decision unit for a first example embodiment.

FIG. 6 is an example decision unit for the example windowed level detector for dicode channels. The outputs of the metric generators of FIGS. 4 and 5 are compared in comparators 601-603. The output of a comparator unit is a logical one if an input labeled A is greater than an input labeled B. The outputs of the comparators are combined in logical negation (NOT) gates 604-606 and logical AND gates 607-609. The output of AND gate 607 is a logical one if the estimate of the central noiseless sample value is -1, and a logical zero otherwise. The output of AND gate 608 is a logical one if the estimate of the central noiseless sample value is 1, and a logical zero otherwise. The output of AND gate 609 is a logical one if the estimate of the central noiseless sample value is 0, and a logical zero otherwise.

In summary, the example windowed level detector for partial response channels a. predetermines each possible noiseless output subsequence of length N of the partial response channel and associates each with a known prior probability, b. calculates a quantity proportional to the posterior probability of each possible subsequence based on the last N outputs of the channel, using an estimate of the probability distribution of the channel output given the possible output subsequence, c. sums subsets of the quantities calculated in (b) to calculate a quantity proportional to the posterior probability of each central noiseless channel output level, d. compares the quantities calculated in (c), to determine a central noiseless channel output level with maximal posterior probability, e. outputs the central noiseless channel output level with maximal posterior probability as an estimate.

An alternative means of implementing the invention for partial response detection is also described, in the alternative means, the metric comparison equations are manipulated to isolate comparisons for a particular sample to be estimated. A detector decision is made by comparing the particular sample to thresholds computed as a function of surrounding noisy samples in the window. Said detector apparatus is denoted a windowed moving threshold detector (WTD).

Specifically, consider a windowed level detector decision rule. In the $i^{th}$ recursion, the detector outputs $\hat{x}_j$, where $i-N \leq j \leq i+1$.

When the windowed level detector compares probabilities to check if the central noiseless output sample L is more likely than the central noiseless output sample L+1, the detector checks if $$\sum_{x_j=L} p[S_q]\exp\left(\frac{1}{2\sigma^2}\sum_{h=1}^{N} B(S_{q,h}, y_{i-N+h})\right) >$$

$$\sum_{x_j=L+1} p[S_r]\exp\left(\frac{1}{2\sigma^2}\sum_{h=1}^{N} B(S_{r,h}, y_{i-N+h})\right).$$

In the inequality of para. [0062], the left side summation is over subsequences, $\{S_q\}$, where the noiseless sample value $x_j=L$, and $S_{q,h}$ denotes the $h^{th}$ noiseless output sample of subsequence $S_q$. Since all sequences in the left side summation have the same central noiseless output sample, $x_j=L$, the corresponding branch output is common to all sequences in the summation.

$$\sum_{x_j=L} p[S_q]\exp\left(\frac{1}{2\sigma^2}\sum_{h=1}^{N} B(S_{q,h}, y_{i-N+h})\right) =$$

$$\sum_{x_j=L} p[S_q]\exp\left(\frac{1}{2\sigma^2}\left[B(L, y_j) + \sum_{h=j} B(S_{q,h}, y_{i-N+h})\right]\right)$$

Denote the sub-metric $SM_L$ as $$SM_L = \sum_{x_j=L} p[S_q]\exp\left(\frac{1}{2\sigma^2}\left[\sum_{h=j} B(S_{q,h}, y_{i-N+h})\right]\right).$$

Similarly, the right side summation of para. [0062] is over subsequences, $\{S_r\}$, where the central noiseless sample value $x_j=L+1$, and $S_{r,h}$ denotes the $h^{th}$ sample of subsequence $S_r$. Since all sequences in the right side summation have the same noiseless output sample, $x_j=L+1$, the corresponding branch output is common to all sequences in the summation.

$$\sum_{x_j=L+1} p[S_r]\exp\left(\frac{1}{2\sigma^2}\sum_{h=1}^{N} B(S_{r,h}, y_{i-N+h})\right) =$$

$$\sum_{x_j=L+1} p[S_r]\exp\left(\frac{1}{2\sigma^2}\left[B(L+1, y_j) + \sum_{h\neq j} B(S_{r,h}, y_{i-N+h})\right]\right)$$

Denote the sub-metric $SM_{L+1}$ as $$SM_{L+1} = \sum_{x_j=L+1} p[S_r]\exp\left(\frac{1}{2\sigma^2}\left[\sum_{h\neq j} B(S_{r,h}, y_{i-N+h})\right]\right)$$

When the windowed level detector compares probabilities for noiseless output levels L and L+1, an equivalent comparison checks if $$\exp\left(\frac{B(L, y_j)}{2\sigma^2}\right)SM_L > \exp\left(\frac{B(L+1, y_j)}{2\sigma^2}\right)SM_{L+1}.$$

Taking natural logarithms of both sides of this equation and manipulating terms, the comparison is equivalent to $$\sigma^2\{\ln(SM_L) - \ln(SM_{L+1})\} + L + \frac{1}{2} > y_j.$$

The windowed level detector decision rule is thus shown to be equivalent to setting a moving threshold, which depends on other noisy samples in the sliding window, and deciding between two output level hypotheses based on a comparison of the particular noisy sample with the moving threshold. The detector making output estimates by comparison to moving thresholds is referred to as a windowed threshold detector (WTD).

Figure 7:
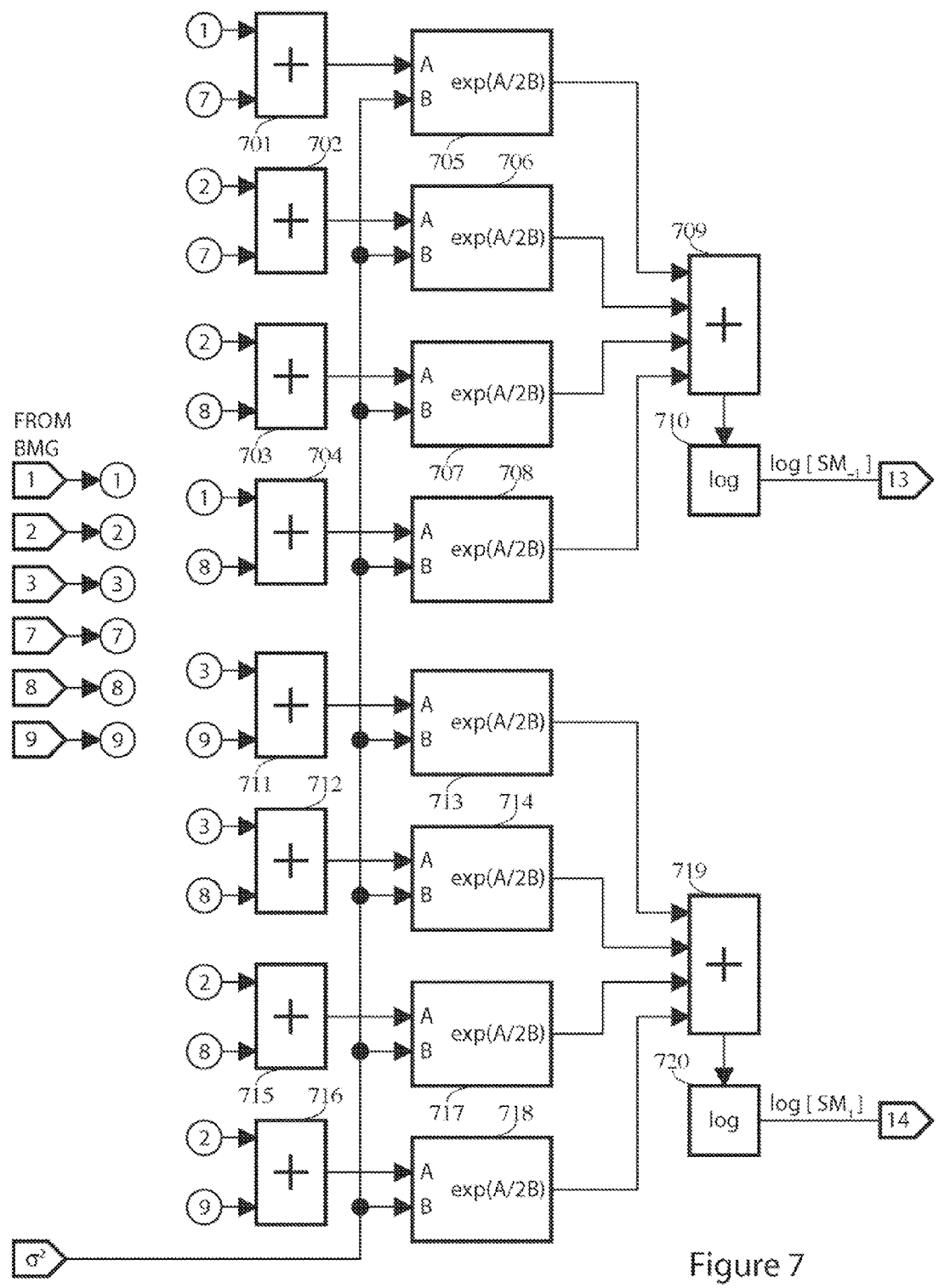
FIG. 7 is a diagram of two example sub-metric generators.
Figure 8:
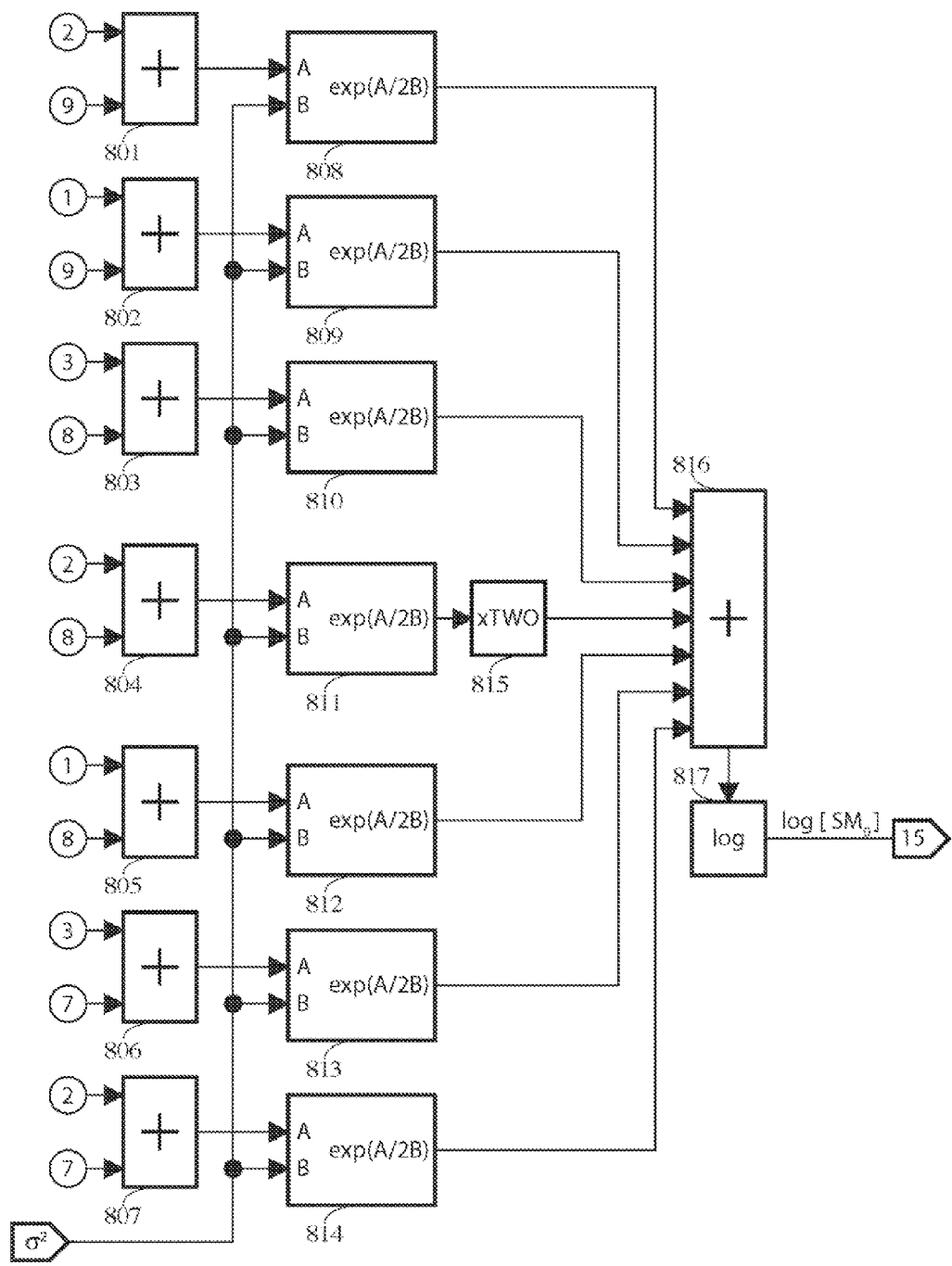
FIG. 8 is a diagram of a third example sub-metric generator.
Figure 9:
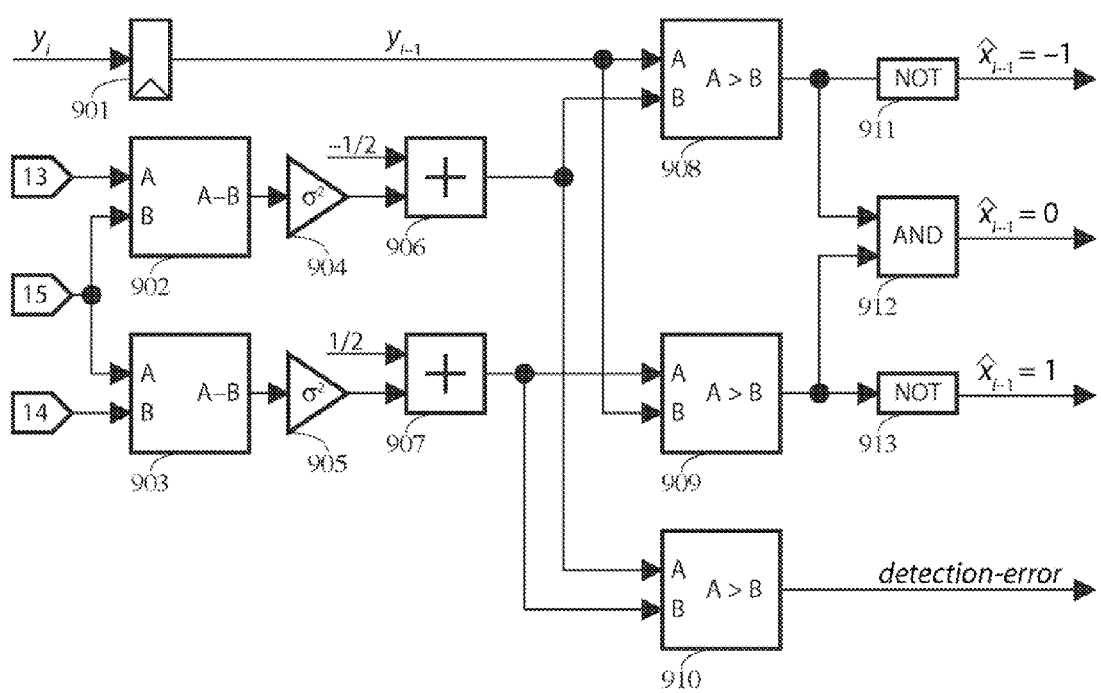
FIG. 9 is a diagram of an example decision unit for a second example embodiment.

A second example embodiment of the detector as a WTD for a dicode channel with window length N equal to three is illustrated in FIGS. 7-9. FIG. 7 is a diagram of two example sub-metric generators, for noiseless sample values of 1 and −1. FIG. 8 is a diagram of an example sub-metric generator for a noiseless sample value of 0. FIG. 9 is a diagram of the decision unit for the second example embodiment.

FIG. 7 illustrates sub-metric generators for non-zero central noiseless sample values. The structure parallels that of FIG. 4, with the top half outputting a sub-metric for a noiseless sample value of −1, and the bottom half outputting a sub-metric for a noiseless sample value of 1. The adders 701-704 correspond to the adders 401-404, except that the summation terms for the central sample have been removed.

The metric for sequence number 3 in Table 1, for example, is a conditional posterior probability based on $\{x_{i-2}, x_{i-1}, x_i\} = \{v_1, v_2, v_3\} = \{1, -1, 0\}$.

The corresponding three branch outputs, $B(1, y_{i-2})$, $B(-1, y_{i-1})$, $B(1, y_i)$, of the BMG are numbered BMG outputs 7, 6, and 2, which are summed in adder 402 of FIG. 4. In FIG. 7, adder 702 produces a term related to the sub-metric for sequence number 3 in Table 1, obtained by adding BMG outputs 7 and 2. The output of adder 702 is input to exponentiator unit 706 performing the same function as exponentiator unit 406. Adder 709 accumulates the various subsequence sub-metrics for subsequences with a central sample value of −1, akin to the functionality of adder 409 in accumulating the various subsequence metrics for subsequences with a central sample value of −1. Finally, logarithm unit 710 outputs the natural logarithm of the output of adder 709. Similarly, logarithm unit 720 outputs the natural logarithm of the output of adder 719.

FIG. 8 illustrates the generation of a sub-metric for subsequences with a central sample value of 0, akin to the metric generator of FIG. 5. Adders 801-807 correspond to adders 501-507, except that the branch unit input from the central sample has been removed from each adder in FIG. 8. The outputs of exponentiators 808-814 are weighted according to prior sequence probabilities and summed in adder 816. Finally, logarithm unit 817 outputs the natural logarithm of the output of adder 816.

FIG. 9 illustrates the decision unit for the example WTD for dicode channels. Outputs 13, 14, and 15 of FIGS. 7 and 8 are input to two subtraction units 902, 903. Unit 902 outputs $$\ln[SM_{-1}]-\ln[SM_0],$$

and unit 903 outputs $$\ln[SM_0]-\ln[SM_1].$$

The outputs of the subtraction units are scaled by the noise variance in scalar units 904, 905, and added to thresholds equal to −½ and ½ in adders 906, 907, resp., to create moving thresholds for a central sample in the window, $y_{i-1}$, provided at the output of synchronous register 901. Units 908 and 909 compare the central sample to the thresholds. The outputs of comparators 908 and 909 are combined in logical AND unit 912 and logical negation (NOT) units 911, 913 to produce three output signals. The output of NOT gate 911 indicates if the estimated sample value is a −1, the output of NOT gate 913 indicates if the estimated sample value is a 1, and the output of AND gate 912 indicates if the estimated sample value is a 0.

Comparator 910 determines when the moving thresholds do not make sense. In normal operation, it is expected that the lower threshold, output from 906, would not exceed the threshold output from the succeeding level comparison, 907. When it does exceed the threshold, the decision unit senses that the output is unreliable, and outputs a "detection-error" flag.

Figure 10:
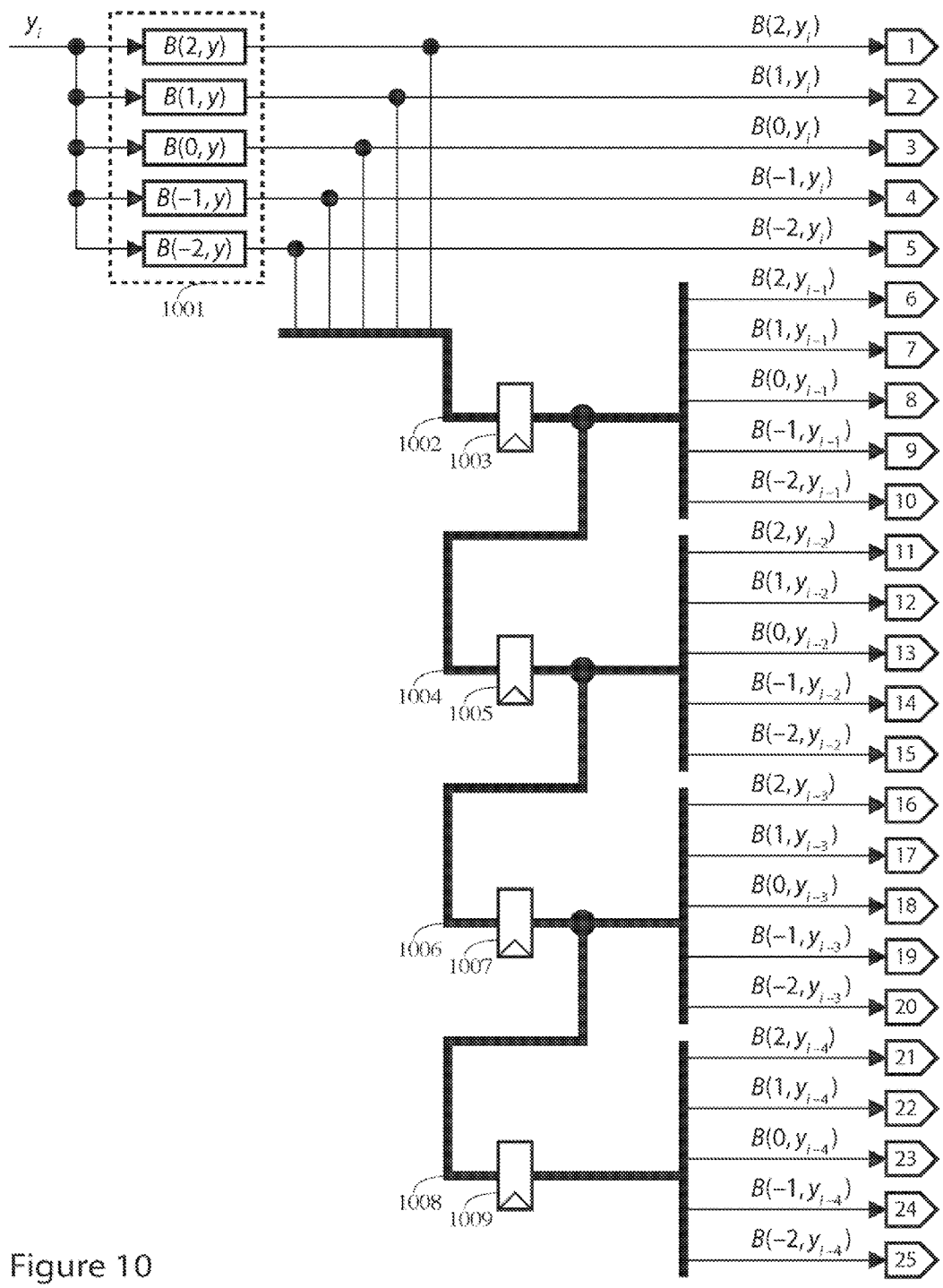
FIG. 10 is a diagram of an example BMG for EPR4 channels with a sliding window length N equal to five.

FIG. 10 is a diagram of an example branch metric generator for a windowed level detector of the present invention, designed for EPR4 channels with a sliding window length N equal to five. A noiseless EPR4 channel with binary inputs has the property that the output takes on five distinct values, −2, −1, 0, 1, and 2.

Because EPR4 has five-level noiseless outputs, there are five branch units, defined as before, in branch bank unit 1001. The outputs of the branch bank unit are $B(-2, y_i)$, $B(-1, y_i)$, $B(0, y_i)$, $B(1, y_i)$, and $B(2, y_i)$. These outputs are combined in parallel bus 1002 and input to synchronous register bank 1003. The register bank 1003 delays the input bus 1002 by one cycle, producing an output bus 1004 containing parallel outputs $B(-2, y_{i-1})$, $B(-1, y_{i-1})$, $B(0, y_{i-1})$, $B(1, y_{i-1})$, and $B(2, y_{i-1})$. Similarly, register bank 1005 delays the input bus 1004 by one cycle, producing an output, bus 1006 containing parallel outputs $B(-2, y_{i-2})$, $B(-1, y_{i-2})$, $B(0, y_{i-2})$, $B(1, y_{i-2})$, and $B(2, y_{i-2})$. The output of register bank 1007 is an output bus 1008 containing parallel outputs $B(-2, y_{i-3})$, $B(-1, y_{i-3})$, $B(0, y_{i-3})$, $B(1, y_{i-3})$, and $B(2, y_{i-3})$, and the output of register bank 1009 is $B(-2, y_{i-4})$, $B(-1, y_{i-4})$, $B(0, y_{i-4})$, $B(1, y_{i-4})$, and $B(2, y_{i-4})$.

The noiseless five sample sequences for a random input EPR4 channel are listed in Appendices A-E. Appendix A, B, C, D, or E lists all sequences with a central sample value of −2, −1, 0, 1, or 2, respectively.

In one embodiment, the three metric (or sub-metric) generator units for the dicode channel may be replaced with five similar metric (or sub-metric) generator units for EPR4, one for each noiseless central sample value.

Figure 11:
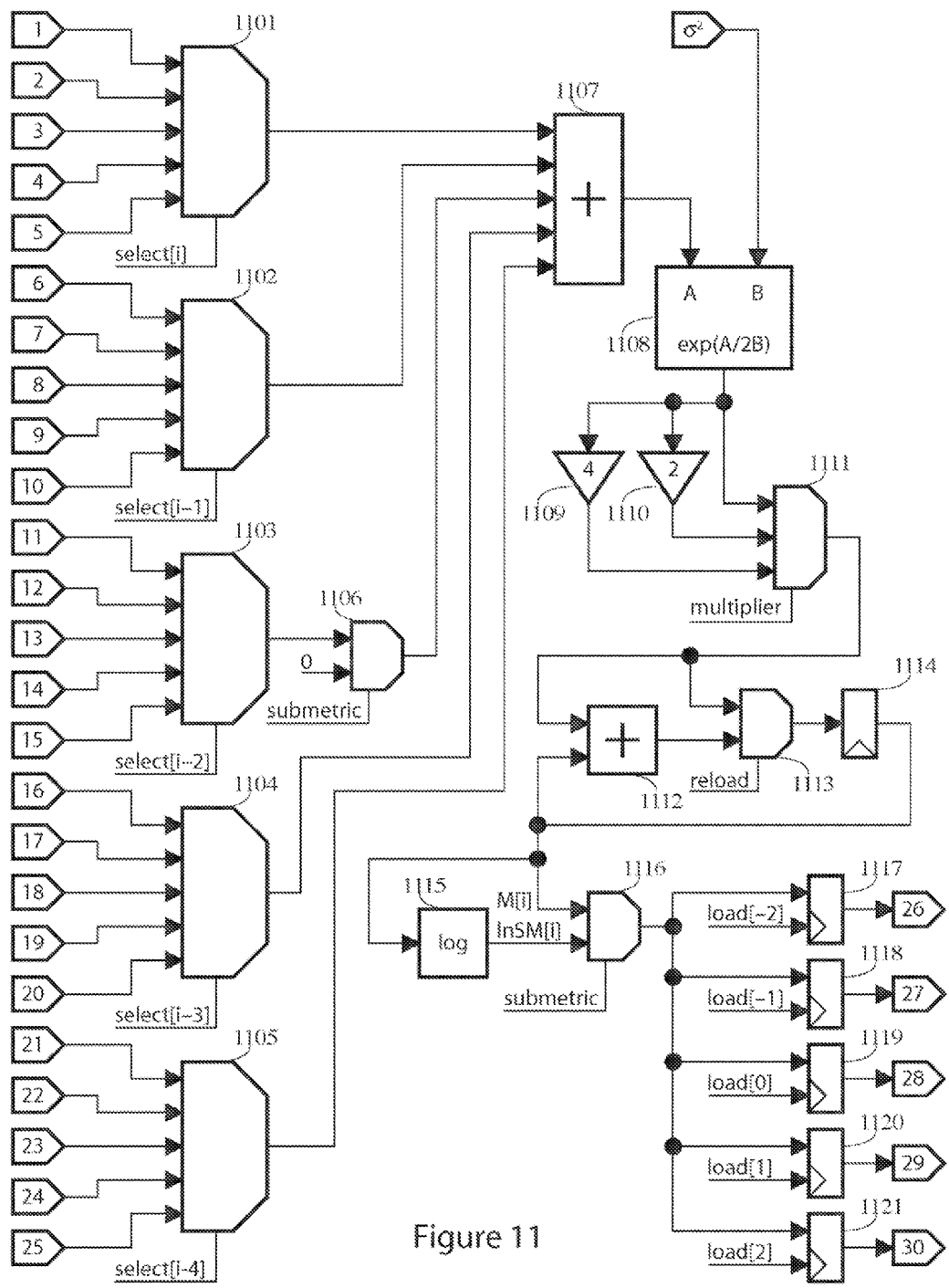
FIG. 11 is an example metric or sub-metric generator for EPR4.

FIG. 11 illustrates an alternative embodiment of a level metric or sub-metric generator for an example EPR4 detector. Note that any of the metric generators in FIGS. 4-5, or the sub-metric generators in FIGS. 7-8, may be considered fully parallel implementations, in that each contains a combination of an adder-exponentiator unit for each sequence, conditional sequence probabilities for all sequences are computed in parallel, and an adder for each output level combines sequence probabilities for that level. In the alternative embodiment of FIG. 11, a single, versatile circuit computes the conditional probabilities for all sequences, one at a time. An advantage of said embodiment is that it saves circuit area by increasing the number of computation cycles per output estimate.

Referring to FIG. 11, multiplexer (MUX) 1101 outputs one of the first five outputs of the EPR4 BMG, determined by a control address labeled "select[i]." Control circuitry (not shown) determines the Nth noiseless output of a possible noiseless channel output sequence and selects the appropriate branch unit output. Similarly, MUXs 1102-1105 select the appropriate branch unit, output for the $N-1^{th}, \ldots, 2^{nd}$, and $1^{st}$ of the noiseless outputs in the subsequence, respectively.

MUXs 1106, 1116 determine the overall functionality of FIG. 11. If level metrics are desired, deassertion of the control line "submetric" in each MUX selects the uppermost MUX input as the MUX output. If sub-metrics are desired, assertion of the control line "submetric" selects the lowermost MUX input as the MUX output. If metrics are desired, adder 1107 outputs the sum of outputs of MUXs 1101-1105, but if sub-metrics are desired, adder 1107 outputs the sum of outputs of MUXs 1101, 1102, 1104, and 1105. The output of adder 1107 is input to exponentiator 1108.

In FIG. 11, scalars 1109, 1110 and MUX 1111 scale the output of exponentiator 1108 to account for the ratios of various prior sequence probabilities. The control line "multiplier" selects the output of MUX 1111 as one, two, or four times the output of exponentiator 1108.

In FIG. 11, adder 1112, MUX 1113 and synchronous register 1114 are connected to accumulate sequence metrics or sub-metrics. The control line "reload" is asserted at the beginning of each accumulation, selecting the uppermost MUX input as the MUX output. The remaining sequence probabilities are added by deasserting "reload" and adding a previously accumulated output of 1114 to an output of MUX 1111.

When metrics are desired, i.e., "submetric" is deasserted, and an entire metric for a given level has been accumulated, it is loaded into one of the level metric registers 1117-1121, which store the level metrics for levels −2, −1, 0, 1, and 2, respectively. When "submetric" is asserted, MUX 1116 instead outputs the natural logarithm of a sub-metric output by log unit 1115. In this mode, registers 1117-1121 store the logs of sub-metrics for levels −2, −1, 0, 1, and 2, respectively. The register outputs 26-30 are fed to a decision unit.

Referring to Appendix C, eighty-three sequences with a central noiseless sample value of zero are listed. Three example subsequences are explained in detail, C1={0, 0, 0, 0, 0},
C12={−1, −1, 0, 0, 1}, and
C27={2, 1, 0, −1, −2}.

The EPR4 BMG outputs of FIG. 10 for C1 are numbered 3, 8, 13, 18, and 23, selected by MUXs 1101-1105 of FIG. 11. If a metric is desired, all five terms are added in 1107. If a sub-metric is desired, the center term is not added in 1107. The output of 1107 is input to exponentiator 1108. The output of 1109 is output by MUX 1111, which multiplies by the multiplier, 4, listed in Appendix C for C1.

The EPR4 BMG outputs of FIG. 10 for C12 are numbered 2, 8, 13, 19, and 24, selected by MUXs 1101-1105 of FIG. 11. The output of 1110 is output by MUX 1111, which multiplies by the multiplier, 2, listed in Appendix C for C12.

The EPR4 BMG outputs of FIG. 10 for C27 are numbered 5, 8, 13, 17, and 21, selected by MUXs 1101-1105 of FIG. 11. The output of 1108 is output by MUX 1111, which multiplies by the multiplier, 1, listed in Appendix C for C27.

In this manner, a combination of an adder and exponentiator is reused to provide for each of the 81 subsequences listed in Appendix C with a noiseless central sample value of 0. The outputs are summed in accumulator 1112-1114 and loaded into register 1119. After the result for a central noiseless sample value of 0 has been determined, the circuit of FIG. 11 may proceed in like manner for the remaining noiseless sample values.

In one embodiment shown, the unit shown in FIG. 11 calculates a level metric for each of the levels, one at a time. Those of skill in the art will recognize that, alternatively, the components 1101-1116 may be replicated as a separate unit for each of the five noiseless output levels of EPR4, said five separate units operating in parallel.

Figure 12:
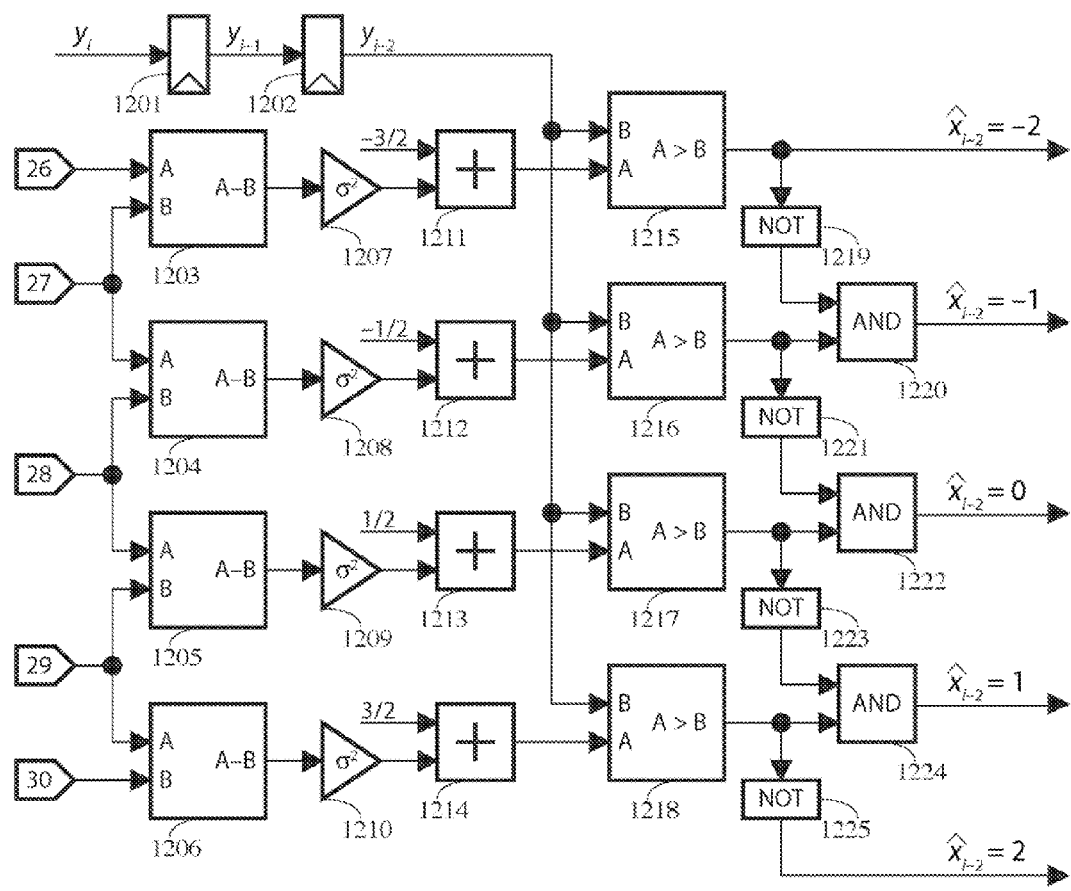
FIG. 12 is an example decision unit for a third example embodiment.
Figure 13:
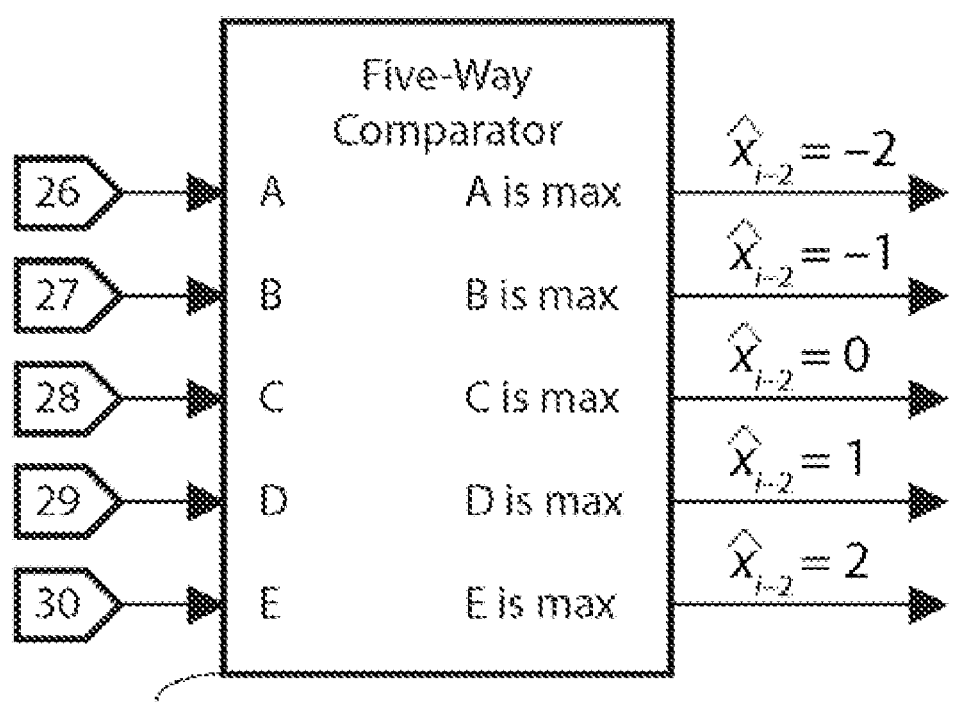
FIG. 13 is an example decision unit for a fourth example embodiment.

FIG. 12 is an example decision unit for an example EPR4 WTD detector using sub-metrics and varying thresholds. The detection-error flagging of FIG. 9 has been omitted from FIG. 12 for clarity, but may be optionally added as before. FIG. 13 is an example decision unit for an example EPR4 WLD detector using metrics and metric comparisons.

While a number of exemplary aspects and embodiments have been discussed above, those of skill in the art will recognize certain modifications, permutations, additions and sub-combinations thereof. It is therefore intended that the following appended claims and claims hereafter introduced are interpreted to include all such modifications, permutations, additions and sub-combinations as are within their true spirit and scope.

APPENDIX A

Noiseless output subsequences with 3rd sample equal to −2.

| Sequence | x[i − 4] | x[i − 3] | x[i − 2] | x[i − 1] | x[i] | Multiplier |
|---|---|---|---|---|---|---|
| A1 | 2 | 0 | −2 | −1 | 0 | 1 |
| A2 | 1 | 0 | −2 | −1 | 0 | 1 |
| A3 | 1 | −1 | −2 | −1 | 0 | 1 |
| A4 | 0 | −1 | −2 | −1 | 0 | 1 |
| A5 | 2 | 0 | −2 | 0 | 1 | 1 |
| A6 | 1 | 0 | −2 | 0 | 1 | 1 |
| A7 | 1 | −1 | −2 | 0 | 1 | 1 |
| A8 | 0 | −1 | −2 | 0 | 1 | 1 |
| A9 | 2 | 0 | −2 | −1 | 1 | 1 |
| A10 | 1 | 0 | −2 | −1 | 1 | 1 |
| A11 | 1 | −1 | −2 | −1 | 1 | 1 |
| A12 | 0 | −1 | −2 | −1 | 1 | 1 |
| A13 | 2 | 0 | −2 | 0 | 2 | 1 |
| A14 | 1 | 0 | −2 | 0 | 2 | 1 |
| A15 | 1 | −1 | −2 | 0 | 2 | 1 |
| A16 | 0 | −1 | −2 | 0 | 2 | 1 |

APPENDIX B

Noiseless output subsequences with 3rd sample equal to −1.

| Sequence | x[i − 4] | x[i − 3] | x[i − 2] | x[i − 1] | x[i] | Multiplier |
|---|---|---|---|---|---|---|
| B1 | 1 | −1 | −1 | 0 | 0 | 2 |
| B2 | 0 | −1 | −1 | 0 | 0 | 2 |
| B3 | 1 | 1 | −1 | −1 | 0 | 2 |
| B4 | 0 | 0 | −1 | −1 | 0 | 2 |
| B5 | 1 | −1 | −1 | 1 | 1 | 2 |
| B6 | 0 | −1 | −1 | 1 | 1 | 2 |
| B7 | 1 | 1 | −1 | −1 | 1 | 2 |
| B8 | 0 | 0 | −1 | −1 | 1 | 2 |
| B9 | 0 | −2 | −1 | 0 | 0 | 1 |
| B10 | −1 | −2 | −1 | 0 | 0 | 1 |
| B11 | 0 | 1 | −1 | −1 | 0 | 1 |
| B12 | −1 | 0 | −1 | −1 | 0 | 1 |
| B13 | 2 | 1 | −1 | −2 | −1 | 1 |
| B14 | 1 | 1 | −1 | −2 | −1 | 1 |
| B15 | 1 | 0 | −1 | −2 | −1 | 1 |
| B16 | 0 | 0 | −1 | −2 | −1 | 1 |
| B17 | 2 | 0 | −1 | 0 | −1 | 1 |
| B18 | 1 | 0 | −1 | 0 | −1 | 1 |
| B19 | 1 | −1 | −1 | 0 | −1 | 1 |
| B20 | 0 | −1 | −1 | 0 | −1 | 1 |
| B21 | 0 | −2 | −1 | 1 | 1 | 1 |
| B22 | −1 | −2 | −1 | 1 | 1 | 1 |
| B23 | 1 | 1 | −1 | 0 | 1 | 1 |
| B24 | 0 | 1 | −1 | 0 | 1 | 1 |
| B25 | 0 | 0 | −1 | 0 | 1 | 1 |
| B26 | −1 | 0 | −1 | 0 | 1 | 1 |
| B27 | 2 | 1 | −1 | −1 | 0 | 1 |
| B28 | 1 | 0 | −1 | −1 | 0 | 1 |
| B29 | 2 | 0 | −1 | 1 | 0 | 1 |
| B30 | 1 | 0 | −1 | 1 | 0 | 1 |
| B31 | 1 | −1 | −1 | 1 | 0 | 1 |
| B32 | 0 | −1 | −1 | 1 | 0 | 1 |
| B33 | 1 | −1 | −1 | 0 | 1 | 1 |
| B34 | 0 | −1 | −1 | 0 | 1 | 1 |
| B35 | 0 | −2 | −1 | 0 | 1 | 1 |
| B36 | −1 | −2 | −1 | 0 | 1 | 1 |
| B37 | 0 | 1 | −1 | −1 | 1 | 1 |
| B38 | −1 | 0 | −1 | −1 | 1 | 1 |
| B39 | 2 | 1 | −1 | −2 | 0 | 1 |
| B40 | 1 | 1 | −1 | −2 | 0 | 1 |
| B41 | 1 | 0 | −1 | −2 | 0 | 1 |
| B42 | 0 | 0 | −1 | −2 | 0 | 1 |
| B43 | 2 | 0 | −1 | 0 | 0 | 1 |
| B44 | 1 | 0 | −1 | 0 | 0 | 1 |
| B45 | 1 | −1 | −1 | 1 | 2 | 1 |
| B46 | 0 | −1 | −1 | 1 | 2 | 1 |
| B47 | 0 | −2 | −1 | 1 | 2 | 1 |
| B48 | −1 | −2 | −1 | 1 | 2 | 1 |
| B49 | 1 | 1 | −1 | 0 | 2 | 1 |
| B50 | 0 | 1 | −1 | 0 | 2 | 1 |
| B51 | 0 | 0 | −1 | 0 | 2 | 1 |
| B52 | −1 | 0 | −1 | 0 | 2 | 1 |
| B53 | 2 | 1 | −1 | −1 | 1 | 1 |
| B54 | 1 | 0 | −1 | −1 | 1 | 1 |
| B55 | 2 | 0 | −1 | 1 | 1 | 1 |
| B56 | 1 | 0 | −1 | 1 | 1 | 1 |

APPENDIX C

Noiseless output subsequences with 3rd sample equal to 0.

| Sequence | x[i − 4] | x[i − 3] | x[i − 2] | x[i − 1] | x[i] | Multiplier |
|---|---|---|---|---|---|---|
| C1 | 0 | 0 | 0 | 0 | 0 | 4 |
| C2 | −1 | 0 | 0 | 0 | 0 | 2 |
| C3 | −1 | −1 | 0 | 0 | 0 | 2 |
| C4 | 1 | 0 | 0 | −1 | −1 | 2 |
| C5 | 0 | 0 | 0 | −1 | −1 | 2 |
| C6 | 1 | 1 | 0 | 0 | −1 | 2 |
| C7 | 0 | 0 | 0 | 0 | −1 | 2 |
| C8 | 0 | 0 | 0 | 1 | 1 | 2 |
| C9 | −1 | 0 | 0 | 1 | 1 | 2 |

APPENDIX C-continued

Noiseless output subsequences with 3rd sample equal to 0.

| Sequence | x[i − 4] | x[i − 3] | x[i − 2] | x[i − 1] | x[i] | Multiplier |
|---|---|---|---|---|---|---|
| C10 | 1 | 0 | 0 | 0 | 0 | 2 |
| C11 | 0 | 0 | 0 | 0 | 1 | 2 |
| C12 | −1 | −1 | 0 | 0 | 1 | 2 |
| C13 | 1 | 1 | 0 | 0 | 0 | 2 |
| C14 | −2 | −1 | 0 | 0 | 0 | 1 |
| C15 | 0 | −1 | 0 | −1 | −1 | 1 |
| C16 | −1 | −1 | 0 | −1 | −1 | 1 |
| C17 | 1 | 2 | 0 | −2 | −1 | 1 |
| C18 | 0 | 2 | 0 | −2 | −1 | 1 |
| C19 | 0 | 1 | 0 | −2 | −1 | 1 |
| C20 | −1 | 1 | 0 | −2 | −1 | 1 |
| C21 | 1 | −1 | 0 | 1 | −1 | 1 |
| C22 | 0 | −1 | 0 | 1 | −1 | 1 |
| C23 | 0 | −2 | 0 | 1 | −1 | 1 |
| C24 | −1 | −2 | 0 | 1 | −1 | 1 |
| C25 | 0 | 1 | 0 | 0 | −1 | 1 |
| C26 | −1 | 0 | 0 | 0 | −1 | 1 |
| C27 | 2 | 1 | 0 | −1 | −2 | 1 |
| C28 | 1 | 1 | 0 | −1 | −2 | 1 |
| C29 | 1 | 0 | 0 | −1 | −2 | 1 |
| C30 | 0 | 0 | 0 | −1 | −2 | 1 |
| C31 | −1 | −1 | 0 | 1 | 1 | 1 |
| C32 | −2 | −1 | 0 | 1 | 1 | 1 |
| C33 | 0 | −1 | 0 | 0 | 0 | 1 |
| C34 | 1 | 2 | 0 | −1 | 0 | 1 |
| C35 | 0 | 2 | 0 | −1 | 0 | 1 |
| C36 | 0 | 1 | 0 | −1 | 0 | 1 |
| C37 | −1 | 1 | 0 | −1 | 0 | 1 |
| C38 | 1 | −1 | 0 | 2 | 0 | 1 |
| C39 | 0 | −1 | 0 | 2 | 0 | 1 |
| C40 | 0 | −2 | 0 | 2 | 0 | 1 |
| C41 | −1 | −2 | 0 | 2 | 0 | 1 |
| C42 | 1 | 1 | 0 | 1 | 0 | 1 |
| C43 | 0 | 1 | 0 | 1 | 0 | 1 |
| C44 | 0 | 0 | 0 | 1 | 0 | 1 |
| C45 | −1 | 0 | 0 | 1 | 0 | 1 |
| C46 | 2 | 1 | 0 | 0 | −1 | 1 |
| C47 | 1 | 0 | 0 | 0 | −1 | 1 |
| C48 | −1 | 0 | 0 | 0 | 1 | 1 |
| C49 | −2 | −1 | 0 | 0 | 1 | 1 |
| C50 | 1 | 0 | 0 | −1 | 0 | 1 |
| C51 | 0 | 0 | 0 | −1 | 0 | 1 |
| C52 | 0 | −1 | 0 | −1 | 0 | 1 |
| C53 | −1 | −1 | 0 | −1 | 0 | 1 |
| C54 | 1 | 2 | 0 | −2 | 0 | 1 |
| C55 | 0 | 2 | 0 | −2 | 0 | 1 |
| C56 | 0 | 1 | 0 | −2 | 0 | 1 |
| C57 | −1 | 1 | 0 | −2 | 0 | 1 |
| C58 | 1 | −1 | 0 | 1 | 0 | 1 |
| C59 | 0 | −1 | 0 | 1 | 0 | 1 |
| C60 | 0 | −2 | 0 | 1 | 0 | 1 |
| C61 | −1 | −2 | 0 | 1 | 0 | 1 |
| C62 | 0 | 1 | 0 | 0 | 0 | 1 |
| C63 | 2 | 1 | 0 | −1 | −1 | 1 |
| C64 | 1 | 1 | 0 | −1 | −1 | 1 |
| C65 | 0 | 0 | 0 | 1 | 2 | 1 |
| C66 | −1 | 0 | 0 | 1 | 2 | 1 |
| C67 | −1 | −1 | 0 | 1 | 2 | 1 |
| C68 | −2 | −1 | 0 | 1 | 2 | 1 |
| C69 | 1 | 0 | 0 | 0 | 1 | 1 |
| C70 | 0 | −1 | 0 | 0 | 1 | 1 |
| C71 | 1 | 2 | 0 | −1 | 1 | 1 |
| C72 | 0 | 2 | 0 | −1 | 1 | 1 |
| C73 | 0 | 1 | 0 | −1 | 1 | 1 |
| C74 | −1 | 1 | 0 | −1 | 1 | 1 |
| C75 | 1 | −1 | 0 | 2 | 1 | 1 |
| C76 | 0 | −1 | 0 | 2 | 1 | 1 |
| C77 | 0 | −2 | 0 | 2 | 1 | 1 |
| C78 | −1 | −2 | 0 | 2 | 1 | 1 |
| C79 | 1 | 1 | 0 | 1 | 1 | 1 |
| C80 | 0 | 1 | 0 | 1 | 1 | 1 |
| C81 | 2 | 1 | 0 | 0 | 0 | 1 |

APPENDIX D

Noiseless output subsequences with 3rd sample equal to 1.

| Sequence | x[i − 4] | x[i − 3] | x[i − 2] | x[i − 1] | x[i] | Multiplier |
|---|---|---|---|---|---|---|
| D1 | 0 | 1 | 1 | −1 | −1 | 2 |
| D2 | −1 | 1 | 1 | −1 | −1 | 2 |
| D3 | 0 | 0 | 1 | 1 | −1 | 2 |
| D4 | −1 | −1 | 1 | 1 | −1 | 2 |
| D5 | 0 | 1 | 1 | 0 | 0 | 2 |
| D6 | −1 | 1 | 1 | 0 | 0 | 2 |
| D7 | 0 | 0 | 1 | 1 | 0 | 2 |
| D8 | −1 | −1 | 1 | 1 | 0 | 2 |
| D9 | −1 | 0 | 1 | −1 | −1 | 1 |
| D10 | −2 | 0 | 1 | −1 | −1 | 1 |
| D11 | −1 | 0 | 1 | 1 | −1 | 1 |
| D12 | −2 | −1 | 1 | 1 | −1 | 1 |
| D13 | 1 | 0 | 1 | 0 | −2 | 1 |
| D14 | 0 | 0 | 1 | 0 | −2 | 1 |
| D15 | 0 | −1 | 1 | 0 | −2 | 1 |
| D16 | −1 | −1 | 1 | 0 | −2 | 1 |
| D17 | 1 | 2 | 1 | −1 | −2 | 1 |
| D18 | 0 | 2 | 1 | −1 | −2 | 1 |
| D19 | 0 | 1 | 1 | −1 | −2 | 1 |
| D20 | −1 | 1 | 1 | −1 | −2 | 1 |
| D21 | −1 | 0 | 1 | 0 | 0 | 1 |
| D22 | −2 | 0 | 1 | 0 | 0 | 1 |
| D23 | 0 | 0 | 1 | 2 | 0 | 1 |
| D24 | −1 | 0 | 1 | 2 | 0 | 1 |
| D25 | −1 | −1 | 1 | 2 | 0 | 1 |
| D26 | −2 | −1 | 1 | 2 | 0 | 1 |
| D27 | 1 | 0 | 1 | 1 | −1 | 1 |
| D28 | 0 | −1 | 1 | 1 | −1 | 1 |
| D29 | 1 | 2 | 1 | 0 | −1 | 1 |
| D30 | 0 | 2 | 1 | 0 | −1 | 1 |
| D31 | 0 | 1 | 1 | 0 | −1 | 1 |
| D32 | −1 | 1 | 1 | 0 | −1 | 1 |
| D33 | 0 | 1 | 1 | −1 | 0 | 1 |
| D34 | −1 | 1 | 1 | −1 | 0 | 1 |
| D35 | −1 | 0 | 1 | −1 | 0 | 1 |
| D36 | −2 | 0 | 1 | −1 | 0 | 1 |
| D37 | −1 | 0 | 1 | 1 | 0 | 1 |
| D38 | −2 | −1 | 1 | 1 | 0 | 1 |
| D39 | 1 | 0 | 1 | 0 | −1 | 1 |
| D40 | 0 | 0 | 1 | 0 | −1 | 1 |
| D41 | 0 | −1 | 1 | 0 | −1 | 1 |
| D42 | −1 | −1 | 1 | 0 | −1 | 1 |
| D43 | 1 | 2 | 1 | −1 | −1 | 1 |
| D44 | 0 | 2 | 1 | −1 | −1 | 1 |
| D45 | 0 | 1 | 1 | 0 | 1 | 1 |
| D46 | −1 | 1 | 1 | 0 | 1 | 1 |
| D47 | −1 | 0 | 1 | 0 | 1 | 1 |
| D48 | −2 | 0 | 1 | 0 | 1 | 1 |
| D49 | 0 | 0 | 1 | 2 | 1 | 1 |
| D50 | −1 | 0 | 1 | 2 | 1 | 1 |
| D51 | −1 | −1 | 1 | 2 | 1 | 1 |
| D52 | −2 | −1 | 1 | 2 | 1 | 1 |
| D53 | 1 | 0 | 1 | 1 | 0 | 1 |
| D54 | 0 | −1 | 1 | 1 | 0 | 1 |
| D55 | 1 | 2 | 1 | 0 | 0 | 1 |
| D56 | 0 | 2 | 1 | 0 | 0 | 1 |

APPENDIX E

Noiseless output subsequences with 3rd sample equal to 2.

| Sequence | x[i − 4] | x[i − 3] | x[i − 2] | x[i − 1] | x[i] | Multiplier |
|---|---|---|---|---|---|---|
| E1 | 0 | 1 | 2 | 0 | −2 | 1 |
| E2 | −1 | 1 | 2 | 0 | −2 | 1 |
| E3 | −1 | 0 | 2 | 0 | −2 | 1 |
| E4 | −2 | 0 | 2 | 0 | −2 | 1 |
| E5 | 0 | 1 | 2 | 1 | −1 | 1 |
| E6 | −1 | 1 | 2 | 1 | −1 | 1 |
| E7 | −1 | 0 | 2 | 1 | −1 | 1 |
| E8 | −2 | 0 | 2 | 1 | −1 | 1 |
| E9 | 0 | 1 | 2 | 0 | −1 | 1 |

APPENDIX E-continued

Noiseless output subsequences with 3rd sample equal to 2.

| Sequence | x[i – 4] | x[i – 3] | x[i – 2] | x[i – 1] | x[i] | Multiplier |
|---|---|---|---|---|---|---|
| E10 | −1 | 1 | 2 | 0 | −1 | 1 |
| E11 | −1 | 0 | 2 | 0 | −1 | 1 |
| E12 | −2 | 0 | 2 | 0 | −1 | 1 |
| E13 | 0 | 1 | 2 | 1 | 0 | 1 |
| E14 | −1 | 1 | 2 | 1 | 0 | 1 |
| E15 | −1 | 0 | 2 | 1 | 0 | 1 |
| E16 | −2 | 0 | 2 | 1 | 0 | 1 |

What is claimed is:

1. A method comprising:
receiving a synchronously sampled output of a partial response channel, said output corrupted by noise; and
processing, at the [i]th received output of the partial response channel, by:
using
(a) a window of N most recent noisy outputs of the partial response channel,
(b) all distinct sequences of N most recent noiseless outputs possible at the output of the partial response channel,
(c) the prior probability of each distinct sequence of N most recent noiseless outputs, and
(d) an index j of a noiseless sampled output in the window to be estimated,
determining a set of quantities, each said quantity related to the conditional probability of a noiseless sequence given the window of noisy channel outputs;
determining a metric, for each possible noiseless sampled output level in the [j]th sample in the window, by adding a subset of the quantities;
comparing the determined metrics to find the noiseless sampled output level with largest conditional probability; and
generating the noiseless sampled output level with largest conditional probability as an estimate of the [i−N+j]th noiseless output of the partial response channel.

2. The method of claim 1 wherein a quantity associated with a window of noisy samples, $y[i-N+1], y[i-N+2], \ldots, y[i]$ and a possible noiseless sequence $v[1], v[2], \ldots, v[N]$ with a prior sequence probability is proportional to the product of an exponential term and the prior sequence probability.

3. The method of claim 2 wherein the exponential term is the transcendental number e (∼2.718281828459) raised to a power equal to a numerator term divided by a denominator term.

4. The method of claim 3 wherein the numerator term is a negative distance term, denoted d, reflecting the Euclidean distance between a noisy sequence {y[i−N+1], y[i−N+2], . . . , y[i]} and a possible noiseless sequence {v[1], v[2], . . . , v[N]} of the form $d = -\{(y[i-N+1]-v[1])2+(y[i-N+2]-v[2])2+ \ldots + (y[i]-v[N])2\}.$ 5. The method of claim 3, wherein the denominator term is two times an estimated noise variance.

6. The method of claim 1, wherein a metric for a [j]th noiseless sample value, w[j], is determined by adding the quantity for each possible distinct noiseless sequence with the property that the [j]th noiseless sample value is equal to w[j].

7. The method of claim 1, wherein the partial response channel is an extended class-IV partial response (EPR4) channel.

8. A method comprising:
receiving a synchronously sampled output of a partial response channel, said output corrupted by noise; and
processing, at the [i]th received output of the partial response channel, by:
using
(a) a window of N most recent noisy outputs of the partial response channel,
(b) all distinct sequences of N most recent noiseless outputs possible at the output of the partial response channel,
(c) the prior probability of each distinct sequence of N most recent noiseless outputs, and
(d) an index j of a noiseless sampled output in the window to be estimated;
determining a set of quantities, each said quantity related to the conditional probability of a noiseless sequence given the window of noisy channel outputs;
determining, for each possible noiseless sampled output level in the [j]th sample in the window, a sub-metric by adding a subset of the quantities;
processing the determined sub-metrics to determine a set of thresholds;
comparing the [i−N+j]th noisy channel output with the determined thresholds;
logically combining the comparison outputs to determine the noiseless sampled output level with largest conditional probability;
generating the noiseless sampled output level with largest conditional probability as an estimate of the [i−N+j]th noiseless output of the partial response channel.

9. The method of claim 8 wherein a quantity associated with a window of noisy samples, $y[i-N+1], y[i-N+2], \ldots, y[i]$ and a possible noiseless sequence $v[1], v[2], \ldots, v[N]$ with a prior sequence probability is proportional to the product of an exponential term and the prior sequence probability.

10. The method of claim 9 wherein the exponential term is the transcendental number e (∼2.718281828459) raised to a power equal to a numerator term divided by a denominator term.

11. The method of claim 10 wherein the numerator term is equal to the sum of a negative distance term, denoted d, and a square term, denoted f, of the form $d = -\{(y[i-N+1]-v[1])2+(y[i-N+2]-v[2])2+ \ldots + (y[i]-v[N])2\}$ and $f = (y[i-N+j]-v[j])2.$ 12. The method of claim 10 wherein the denominator term is two times an estimated noise variance.

13. The method of claim 8 wherein a sub-metric for a [j]th noiseless sample value, w[j], is determined by adding the quantity for each possible distinct noiseless sequence with the property that the [j]th noiseless sample value is equal to w[j].

14. The method of claim 8 wherein, denoting the sub-metric for a noiseless output level L as SM[L], the sub-metric for a successive output level L+1 as SM[L+1], and an estimated noise variance as v, the threshold between levels L and L+1 is $$v*\ln\{SM[L]-SM[L+1]\}+L+\frac{1}{2}, \text{ where}$$

ln{x} is the base e or natural logarithm of x.

15. The method of claim 14 wherein the result of a comparison of a first threshold between levels L and L+1 and a second threshold between levels L+1 and L+2 determines a detection error when the first threshold is greater than the second threshold.

16. An apparatus to sequentially estimate a noiseless output of a noisy partial response channel, the apparatus comprising:
   a memory operative to store noisy outputs of a partial response channel and
   a logic circuit operative to:
      access the memory to obtain the N most recent samples of noisy channel output;
      use a set of all possible sequences of the N most recent noiseless outputs of the noisy partial response channel and a prior probability of each such possible sequence;
      process the set of all possible sequences of the N most recent noiseless outputs of the noisy partial response channel by using circuitry operative to:
         determine a sequence metric to associate with each member of the set of all possible sequences;
         determine a level metric to associate with each possible noiseless sample level with a summation unit to add the determined sequence metric for each sequence which takes on said level in a select sample in the window of the N most recent noiseless output samples:
         compare the level metric; and
         determine a maximal level metric in the set of the level metrics; and
         output an estimate for a select sample in the window of N most recent samples equal to the level associated with the maximal level metric.

17. The apparatus of claim 16 further comprising:
   A circuit containing a serial cascade of an adder unit, an exponentiator unit, and a multiplier unit; and
   circuitry to modify the inputs and multiplication constant of said circuit to serially determine a plurality of sequence metrics.

18. An apparatus to sequentially estimate a noiseless output of a noisy partial response channel, the apparatus comprising:
   a memory operative to store noisy outputs of a partial response channel and
   a logic circuit operative to:
      access a window of N most recent samples of a noisy channel output, wherein N is greater than one;
      use
         (a) all distinct sequences of N most recent noiseless outputs possible at the output of the partial response channel,
         (b) the prior probability of each distinct sequence of N most recent noiseless outputs, and
         (c) an index j of a noiseless sampled output in the window to be estimated;
      determine a set of quantities, each said quantity related to the conditional probability of a noiseless sequence given the window of noisy channel outputs;
      determine, for each possible noiseless sampled output level in the [j]th sample in the window, a sub-metric by adding a subset of the quantities;
      process the determined sub-metrics to determine a set of thresholds;
      compare the [i−N+j]th noisy channel output with the determined thresholds;
      logically combine the comparator outputs to determine the noiseless sampled output level with largest conditional probability;
      generate the noiseless sampled output level with largest conditional probability as an estimate of the [i−N+j]th noiseless output of the partial response channel.

19. The apparatus of claim 18 wherein the partial response channel is an extended class-IV partial response (EPR4) channel.

20. The apparatus of claim 18 further comprising:
   A circuit containing a cascade of an adder unit, an exponentiator unit, and a multiplier; and
   circuitry to modify the inputs and multiplication constant of said circuit to serially determine a plurality of sequence sub-metrics.

* * * * *